US011121806B2

(12) United States Patent
Chen et al.

(10) Patent No.: US 11,121,806 B2
(45) Date of Patent: Sep. 14, 2021

(54) DECODING PERFORMANCE

(71) Applicant: QUALCOMM Incorporated, San Diego, CA (US)

(72) Inventors: Jialing Li Chen, San Diego, CA (US); Dung Ngoc Doan, San Diego, CA (US); Bin Tian, San Diego, CA (US); Lin Yang, San Diego, CA (US); Sameer Vermani, San Diego, CA (US); Lochan Verma, San Diego, CA (US); Stephen Jay Shellhammer, Ramona, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 69 days.

(21) Appl. No.: 16/562,907

(22) Filed: Sep. 6, 2019

(65) Prior Publication Data
US 2020/0083983 A1 Mar. 12, 2020

Related U.S. Application Data

(60) Provisional application No. 62/772,042, filed on Nov. 27, 2018, provisional application No. 62/728,737, filed on Sep. 7, 2018.

(51) Int. Cl.
*H04L 5/00* (2006.01)
*H04L 1/00* (2006.01)
(Continued)

(52) U.S. Cl.
CPC ......... *H04L 1/0057* (2013.01); *H04B 7/0417* (2013.01); *H04L 1/0042* (2013.01);
(Continued)

(58) Field of Classification Search
None
See application file for complete search history.

(56) References Cited

U.S. PATENT DOCUMENTS

2007/0143656 A1* 6/2007 Niu ............... H03M 13/618
714/752
2007/0220399 A1* 9/2007 Kim ............... H04L 1/0069
714/758
(Continued)

OTHER PUBLICATIONS

Gopteke et al. Subcode-based Early HARQ for 5G, ICC Workshop, All pages May 2018 (Year: 2018).*
(Continued)

*Primary Examiner* — Brandon M Renner
(74) *Attorney, Agent, or Firm* — Patterson+Sheridan, L.L.P.

(57) ABSTRACT

This disclosure provides systems, methods and apparatus, including computer programs encoded on computer storage media, for low density parity check (LDPC)-based incremental redundancy (IR) hybrid automatic repeat request (HARQ) transmission processing. In one aspect, an apparatus for wireless communications is configured to generate a first packet using a LDPC encoding process. The apparatus is further configured to generate coded bits using a second LDPC encoding process if the first packet is not successfully decoded by a wireless device, generate a second packet including at least some of the coded bits generated using the second LDPC encoding process, and output the second packet for transmission.

30 Claims, 18 Drawing Sheets

(51) Int. Cl.
*H04B 7/0417* (2017.01)
*H04L 1/18* (2006.01)
*H04L 27/26* (2006.01)

(52) U.S. Cl.
CPC .......... *H04L 1/0046* (2013.01); *H04L 1/0068* (2013.01); *H04L 1/1819* (2013.01); *H04L 27/2605* (2013.01)

(56) References Cited

U.S. PATENT DOCUMENTS

| | | | | |
|---|---|---|---|---|
| 2011/0216857 | A1* | 9/2011 | Gotman | H03M 13/27 375/341 |
| 2014/0365845 | A1* | 12/2014 | Pantelias | H04L 1/0045 714/758 |
| 2015/0074485 | A1* | 3/2015 | Jeong | H03M 13/6516 714/755 |
| 2016/0087648 | A1* | 3/2016 | Korb | H03M 13/616 714/752 |
| 2016/0156438 | A1* | 6/2016 | Sun | H04W 72/044 370/330 |
| 2016/0283320 | A1* | 9/2016 | Motwani | G11C 29/42 |
| 2017/0271029 | A1* | 9/2017 | Wang | G11C 29/44 |
| 2018/0067802 | A1* | 3/2018 | Ha | G06F 9/3004 |
| 2019/0181883 | A1* | 6/2019 | Ma | H03M 13/1148 |
| 2019/0181983 | A1* | 6/2019 | Ye | H04L 1/0009 |
| 2020/0066354 | A1* | 2/2020 | Ioannou | G11C 16/0483 |
| 2020/0204195 | A1* | 6/2020 | Yamamoto | H03M 13/2906 |

OTHER PUBLICATIONS

Fowdur T.P., et al., "Performance of IEEE 802.11n LDPC Codes with Modified Reliability Based Hybrid ARQ and Unequal Error Protection", IEEE EUROCON 2015—International Conference on Computer as a Tool (EUROCON), IEEE, Sep. 8, 2015 (Sep. 8, 2015), XP032803187, DOI: 10.1109/EUROCON.2015.7313674, [retrieved on Oct. 30, 2015], abstract, pp. 1-6.

IEEE 802.11 Working Group: "IEEE Standard for Information technology—Telecommunications and information exchange between systems—Local and metropolitan area networks—Specific requirements Part 11: Wireless LAN Medium Access Control (MAC) and Physical Layer (PHY) Specifications Amendment 5: Enhancements for Higher Throughput", IEEE STD 802.11N-2009 (Amendment to IEEE STD 802.11-2007 As Amended by IEEE STD 802.11K-2008, IEEE STD 802.11R-2008, IEEE STD 802.11Y-2008, and IEEE STD 802.11W-2009, Oct. 29, 2009 pp. All Pages.

International Search Report and Written Opinion—PCT/US2019/050115—ISA/EPO—dated Dec. 11, 2019.

Oh J-E., et al., "Row-Splitting Design of Low-Density Parity-Check Codes for Gbps Transmission", Vehicular Technology Conference, 2007, VTC-2007 Fall, 2007 IEEE 66th, IEEE, PI, Sep. 1, 2007, XP031147582, pp. 1127-1131, ISBN: 978-1-4244-0263-2.

* cited by examiner

| | Chase combining (CC) | Incremental redundancy (IR) |
|---|---|---|
| New parity bits in (re)transmisison | No | Yes |
| Buffer size | Fixed | Fixed or incremental |
| LDPC encoding process change | Probably no | Yes |
| Decoder change | No | Yes, except one special case |

FIG. 6

| | Initial transmission | After combining (re)transmission(s) |
|---|---|---|
| Option 1 | Sub-option 1: Use existing decoder for (R1, CW1).<br>Sub-option 2: Use decoder for (R0, CW0) by setting LLRs of unsent parity bits as 0 | Use decoder for (R0, CW0) by setting LLRs of unsent parity bits as 0 |
| Option 2 | Sub-option 1: Use existing decoder for (R1, CW1).<br>Sub-option 2: Use decoder for (R0, CW0) by setting LLRs of unsent parity bits as 0 | Use decoder for (R0, CW0) by setting LLRs of unsent parity bits as 0 |

FIG. 10

| Mother code rate ($R0=\|S\|/CW0$) | Initial code rate ($R1=\|S\|/CW1$) | \|S\| | \|P1\| | \|P2\| | Initial codeword size ($CW1=\|S\|+\|P1\|$) | Mother codeword size ($CW0=\|S\|+\|P1\|+\|P2\|$) |
|---|---|---|---|---|---|---|
| 1/3 | 1/2 | 324 | 324 | 324 | 648 | 972 |
| 1/3 | 2/3 | 432 | 216 | 648 | 648 | 1296 |
| 1/3 | 3/4 | 486 | 162 | 810 | 648 | 1458 |
| 1/3 | 5/6 | 540 | 108 | 972 | 648 | 1620 |
| 1/3 | 1/2 | 648 | 648 | 648 | 1296 | 1944 |
| 1/3 | 2/3 | 864 | 432 | 1296 | 1296 | 2592 |
| 1/3 | 3/4 | 972 | 324 | 1620 | 1296 | 2916 |
| 1/3 | 5/6 | 1080 | 216 | 1944 | 1296 | 3240 |
| 1/3 | 1/2 | 972 | 972 | 972 | 1944 | 2916 |
| 1/3 | 2/3 | 1296 | 648 | 1944 | 1944 | 3888 |
| 1/3 | 3/4 | 1458 | 486 | 2430 | 1944 | 4374 |
| 1/3 | 5/6 | 1620 | 324 | 2916 | 1944 | 4860 |

FIG. 11

| Mother code rate (R0=\|S\|/CW0) | Initial code rate (R1=\|S\|/CW1) | \|S\| | \|P1\| | \|P2\| | Initial codeword size (CW1=\|S\|+\|P1\|) | Mother codeword size (CW0=\|S\|+\|P1\|+\|P2\|) |
|---|---|---|---|---|---|---|
| 1/2 | 1/2 | 324 | 324 | 0 | 648 | 648 |
| 1/2 | 2/3 | 432 | 216 | 216 | 648 | 864 |
| 1/2 | 3/4 | 486 | 162 | 324 | 648 | 972 |
| 1/2 | 5/6 | 540 | 108 | 432 | 648 | 1080 |
| 1/2 | 1/2 | 648 | 648 | 0 | 1296 | 1296 |
| 1/2 | 2/3 | 864 | 432 | 432 | 1296 | 1728 |
| 1/2 | 3/4 | 972 | 324 | 648 | 1296 | 1944 |
| 1/2 | 5/6 | 1080 | 216 | 864 | 1296 | 2160 |
| 1/2 | 1/2 | 972 | 972 | 0 | 1944 | 1944 |
| 1/2 | 2/3 | 1296 | 648 | 648 | 1944 | 2592 |
| 1/2 | 3/4 | 1458 | 486 | 972 | 1944 | 2916 |
| 1/2 | 5/6 | 1620 | 324 | 1296 | 1944 | 3240 |

FIG. 12

| Mother code rate (R0=\|S\|/CW0) | Initial code rate (R1=\|S\|/CW1) | \|S\| | \|P1\| | \|P2\| | Initial codeword size (CW1=\|S\|+\|P1\|) | Mother codeword size (CW0=\|S\|+\|P1\|+\|P2\|) |
|---|---|---|---|---|---|---|
| 1/3 | 1/2 | 216 | 216 | 216 | 432 | 648 |
| 1/3 | 2/3 | 216 | 108 | 324 | 324 | 648 |
| 1/3 | 3/4 | 216 | 72 | 360 | 288 | 648 |
| 1/3 | 5/6 | 216 | 43 1/5 → 43 | 388 4/5 → 389 | 259 1/5 → 259 | 648 |
| 1/3 | 1/2 | 432 | 432 | 432 | 864 | 1296 |
| 1/3 | 2/3 | 432 | 216 | 648 | 648 | 1296 |
| 1/3 | 3/4 | 432 | 144 | 720 | 576 | 1296 |
| 1/3 | 5/6 | 432 | 86 2/5 → 86 | 777 3/5 → 778 | 518 2/5 → 518 | 1296 |
| 1/3 | 1/2 | 648 | 648 | 648 | 1296 | 1944 |
| 1/3 | 2/3 | 648 | 324 | 972 | 972 | 1944 |
| 1/3 | 3/4 | 648 | 216 | 1080 | 864 | 1944 |
| 1/3 | 5/6 | 648 | 129 3/5 → 130 | 1166 2/5 → 1166 | 777 3/5 → 778 | 1944 |

FIG. 13

| Mother code rate $(R_0=|S|/CW0)$ | Initial code rate $(R_1=|S|/CW1)$ | \|S\| | \|P1\| | \|P2\| | Initial codeword size $(CW1=|S|+|P1|)$ | Mother codeword size $(CW0=|S|+|P1|+|P2|)$ |
|---|---|---|---|---|---|---|
| 1/2 | 1/2 | 324 | 324 | 0 | 648 | 648 |
| 1/2 | 2/3 | 324 | 162 | 162 | 486 | 648 |
| 1/2 | 3/4 | 324 | 108 | 216 | 432 | 648 |
| 1/2 | 5/6 | 324 | 64 4/5 → 65 | 259 1/5 → 259 | 388 4/5 → 389 | 648 |
| 1/2 | 1/2 | 648 | 648 | 0 | 1296 | 1296 |
| 1/2 | 2/3 | 648 | 324 | 324 | 972 | 1296 |
| 1/2 | 3/4 | 648 | 216 | 432 | 864 | 1296 |
| 1/2 | 5/6 | 648 | 129 3/5 → 130 | 518 2/5 → 518 | 777 3/5 → 778 | 1296 |
| 1/2 | 1/2 | 972 | 972 | 0 | 1944 | 1944 |
| 1/2 | 2/3 | 972 | 486 | 486 | 1458 | 1944 |
| 1/2 | 3/4 | 972 | 324 | 648 | 1296 | 1944 |
| 1/2 | 5/6 | 972 | 194 2/5 → 194 | 777 3/5 → 778 | 1166 2/5 → 1166 | 1944 |

FIG. 14

| Code Rate | Information Bits | Parity Bits | Code Bits |
|---|---|---|---|
| 1/2 | 972 | 972 | 1944 |
| 2/3 | 1296 | 648 | 1944 |
| 3/4 | 1458 | 486 | 1944 |
| 5/6 | 1620 | 324 | 1944 |

FIG. 15

Code Rate 1/2

| Information Bits | Parity Bits | Code Bits | Puncture Rate (Percent) | Percentage of Code Bits Transmitted | Transmitted Information Bits | Transmitted Parity Bits | Transmitted Bits |
|---|---|---|---|---|---|---|---|
| 972 | 972 | 1944 | 0 | 100 | 972 | 972 | 1944 |
| 972 | 972 | 1944 | 5 | 95 | 972 | 875 | 1847 |
| 972 | 972 | 1944 | 10 | 90 | 972 | 778 | 1750 |
| 972 | 972 | 1944 | 20 | 80 | 972 | 583 | 1555 |

FIG. 16

Code Rate 2/3

| Information Bits | Parity Bits | Code Bits | Puncture Rate (Percent) | Percentage of Code Bits Transmitted | Transmitted Information Bits | Transmitted Parity Bits | Transmitted Bits |
|---|---|---|---|---|---|---|---|
| 1296 | 648 | 1944 | 0 | 100 | 1296 | 648 | 1944 |
| 1296 | 648 | 1944 | 5 | 95 | 1296 | 551 | 1847 |
| 1296 | 648 | 1944 | 10 | 90 | 1296 | 454 | 1750 |
| 1296 | 648 | 1944 | 20 | 80 | 1296 | 259 | 1555 |

FIG. 17

Code Rate 3/4

| Information Bits | Parity Bits | Code Bits | Puncture Rate (Percent) | Percentage of Code Bits Transmitted | Transmitted Information Bits | Transmitted Parity Bits | Transmitted Bits |
|---|---|---|---|---|---|---|---|
| 1458 | 486 | 1944 | 0 | 100 | 1458 | 486 | 1944 |
| 1458 | 486 | 1944 | 5 | 95 | 1458 | 389 | 1847 |
| 1458 | 486 | 1944 | 10 | 90 | 1458 | 292 | 1750 |
| 1458 | 486 | 1944 | 20 | 80 | 1458 | 97 | 1555 |

FIG. 18

Code Rate 5/6

| Information Bits | Parity Bits | Code Bits | Puncture Rate (Percent) | Percentage of Code Bits Transmitted | Transmitted Information Bits | Transmitted Parity Bits | Transmitted Bits |
|---|---|---|---|---|---|---|---|
| 1620 | 324 | 1944 | 0 | 100 | 1620 | 324 | 1944 |
| 1620 | 324 | 1944 | 5 | 95 | 1620 | 227 | 1847 |
| 1620 | 324 | 1944 | 10 | 90 | 1620 | 130 | 1750 |

FIG. 19

DECODING PERFORMANCE

CROSS-REFERENCE TO RELATED APPLICATIONS

This patent application claims priority to U.S. Provisional Patent Applications No. 62/728,737 filed Sep. 7, 2018 entitled "IMPROVING DECODING PERFORMANCE IN WIFI," and No. 62/772,042 filed Nov. 27, 2018 entitled "IMPROVING DECODING PERFORMANCE IN WIFI," both assigned to the assignee hereof. The disclosure of the prior applications are considered part of and are incorporated by reference in this patent application.

TECHNICAL FIELD

Certain aspects of the technology discussed below generally relate to methods and apparatus for low-density parity-check (LDPC) based encoding and decoding.

DESCRIPTION OF THE RELATED TECHNOLOGY

The deployment of wireless local area networks (WLANs, sometimes referred to as WiFi networks) in the home, the office, and various public facilities is commonplace today. Such networks typically employ a wireless access point (AP) that connects a number of wireless stations (STAs) in a specific locality (such as the aforementioned home, office, public facility, etc.) to another network, such as the Internet or the like. A set of STAs can communicate with each other through a common AP in what is referred to as a basic service set (BSS).

Different schemes have been developed in order to address the issue of increasing bandwidth and reliability requirements that are demanded for WLANs. For example, advanced coding schemes have been identified as one of techniques to be considered in the 802.11 family of standards, along with other schemes, such as Multiple-Input Multiple-Output (MIMO) and higher order modulation and coding schemes (MCS).

There are various types of advanced coding schemes, including Turbo coding, LDPC, Trellis Coded Modulation, advanced convolutional codes, and Low-Density Parity-Check (LDPC) code based schemes. LDPC codes have shown potential advantage over other codes in certain applications with high data rates, such as applications considered very high throughput (VHT) and extremely high throughput (EHT) by current and developing 802.11 standards.

SUMMARY

The systems, methods, and devices of the disclosure each have several innovative aspects, no single one of which is solely responsible for its desirable attributes disclosed herein.

One innovative aspect of the subject matter described in this disclosure can be implemented in an apparatus for wireless communication. The apparatus generally includes a processing system configured to generate a first packet using a first low density parity check (LDPC) encoding process, the first packet having a set of information bits and a first set of parity bits and an interface configured to output the first packet for transmission; wherein the processing system is further configured to, generate coded bits using a second LDPC encoding process if the first packet is not successfully decoded by a wireless device, wherein the coded bits generated using the second LDPC process include at least some of the same set of information bits as the first packet and a second set of parity bits, and, generate a second packet including at least some of the coded bits generated using the second LDPC process, and the interface is also configured to output the second packet for transmission.

In some implementations, the second LDPC encoding process generates the coded bits based on information bits generated by the first LDPC encoding process.

In some implementations, the first and second packets are output for transmission as part of an incremental redundancy (IR) hybrid automatic repeat request (HARD) process.

Another innovative aspect of the subject matter described in this disclosure can be implemented in an apparatus for wireless communications. The apparatus generally includes a first interface configured to obtain at least a portion of a first packet generated by a wireless device using a first low density parity check (LDPC) encoding process, the first packet having a set of information bits and a first set of parity bits, a processing system configured to attempt to decode the first packet and generate a negative acknowledgment (NACK) packet notifying the wireless device that the attempt to decode the first packet was unsuccessful; and a second interface configured to output the NACK packet for transmission; wherein the first interface is also configured to obtain at least a portion of a second packet that includes at least a portion of coded bits generated using a second LDPC encoding process, wherein the coded bits include at least some of the same set of information bits as the first packet and a second set of parity bits and the processing system is further configured to combine the portion of the first packet with the portion of the second packet and re-attempt to decode the information bits based on combined first and second packets.

In some implementations, the second LDPC encoding process generates the coded bits based on information bits generated by the first LDPC encoding process.

In some implementations, the first and second packets are output for transmission as part of an incremental redundancy (IR) hybrid automatic repeat request (HARD) process.

Another innovative aspect of the subject matter described in this disclosure can be implemented in a method for wireless communication. The method generally includes generating a first packet using a first low density parity check (LDPC) encoding process, the first packet having a set of information bits and a first set of parity bits, outputting the first packet for transmission, generating coded bits using a second LDPC encoding process if the first packet is not successfully decoded by a wireless device, wherein the coded bits generated using the second LDPC encoding process include at least some of the same set of information bits as the first packet and a second set of parity bits, generating a second packet including at least some of the coded bits generated using the second LDPC encoding process, and outputting the second packet for transmission.

Another innovative aspect of the subject matter described in this disclosure can be implemented in a method for wireless communication. The method generally includes obtaining at least a portion of a first packet having a set of information bits and a first set of parity bits, attempting to decode the information bits of the first packet using a first low density parity check (LDPC) decoding process, generating a negative acknowledgment (NACK) packet notifying a wireless device that at least a portion of the information bits was not successfully decoded, outputting the NACK packet for transmission, obtaining at least a portion of a second packet, combining the portion of the first packet with the portion of the second packet, and re-attempting to decode the portion of the information bits that was not successfully decoded based on combined first and second packets using a second LDPC decoding process.

Another innovative aspect of the subject matter described in this disclosure can be implemented in an apparatus for wireless communication. The apparatus generally includes means for generating a first packet using a first low density parity check (LDPC) encoding process, the first packet having a set of information bits and a first set of parity bits, means for outputting the first packet for transmission, means for generating coded bits using a second LDPC encoding process if the first packet is not successfully decoded by a wireless device, wherein the coded bits generated using the second LDPC encoding process include at least some of the same set of information bits as the first packet and a second set of parity bits, means for generating a second packet including at least some of the coded bits generated using the second LDPC encoding process, and means for outputting the second packet for transmission.

Another innovative aspect of the subject matter described in this disclosure can be implemented in an apparatus for wireless communication. The apparatus generally includes means for obtaining at least a portion of a first packet having a set of information bits and a first set of parity bits, means for attempting to decode the information bits of the first packet using a first low density parity check (LDPC) decoding process, means for generating a negative acknowledgment (NACK) packet notifying a wireless device that at least a portion of the information bits was not successfully decoded, means for outputting the NACK packet for transmission, means for obtaining at least a portion of a second packet, means for combining the portion of the first packet with the portion of the second packet, and means for re-attempting to decode the portion of the information bits that was not successfully decoded based on combined first and second packets using a second LDPC decoding process.

Another innovative aspect of the subject matter described in this disclosure can be implemented in a computer-readable medium for wireless communications, comprising codes executable to generate a first packet using a first low density parity check (LDPC) encoding process, the first packet having a set of information bits and a first set of parity bits, output the first packet for transmission, generate coded bits using a second LDPC encoding process if the first packet is not successfully decoded by a wireless device, wherein the coded bits generated using the second LDPC encoding process include at least some of the same set of information bits as the first packet and a second set of parity bits, generate a second packet including at least some of the coded bits generated using the second LDPC encoding process, and output the second packet for transmission.

Another innovative aspect of the subject matter described in this disclosure can be implemented in a computer-readable medium for wireless communications, comprising codes executable to obtain at least a portion of a first packet having a set of information bits and a first set of parity bits, attempt to decode the information bits of the first packet using a first low density parity check (LDPC) decoding process, generate a negative acknowledgment (NACK) packet notifying a wireless device that at least a portion of the information bits was not successfully decoded, output the NACK packet for transmission, obtain at least a portion of a second packet, combine the portion of the first packet with the portion of the second packet, and re-attempt to decode the portion of the information bits that was not successfully decoded based on combined first and second packets using a second LDPC decoding process.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 6 shows an overview of example combining techniques.

FIG. 10 shows example HARQ encoding techniques.

FIGS. 11-14 show example IR-HARQ encoding configurations based on different mother code rates.

FIG. 15 shows example parity and code bits for different code rates.

FIGS. 16-19 show example IR-HARQ encoding configurations based on the code rates shown in FIG. 15.

Like reference numbers and designations in the various drawings indicate like elements.

DETAILED DESCRIPTION

Figure 1:
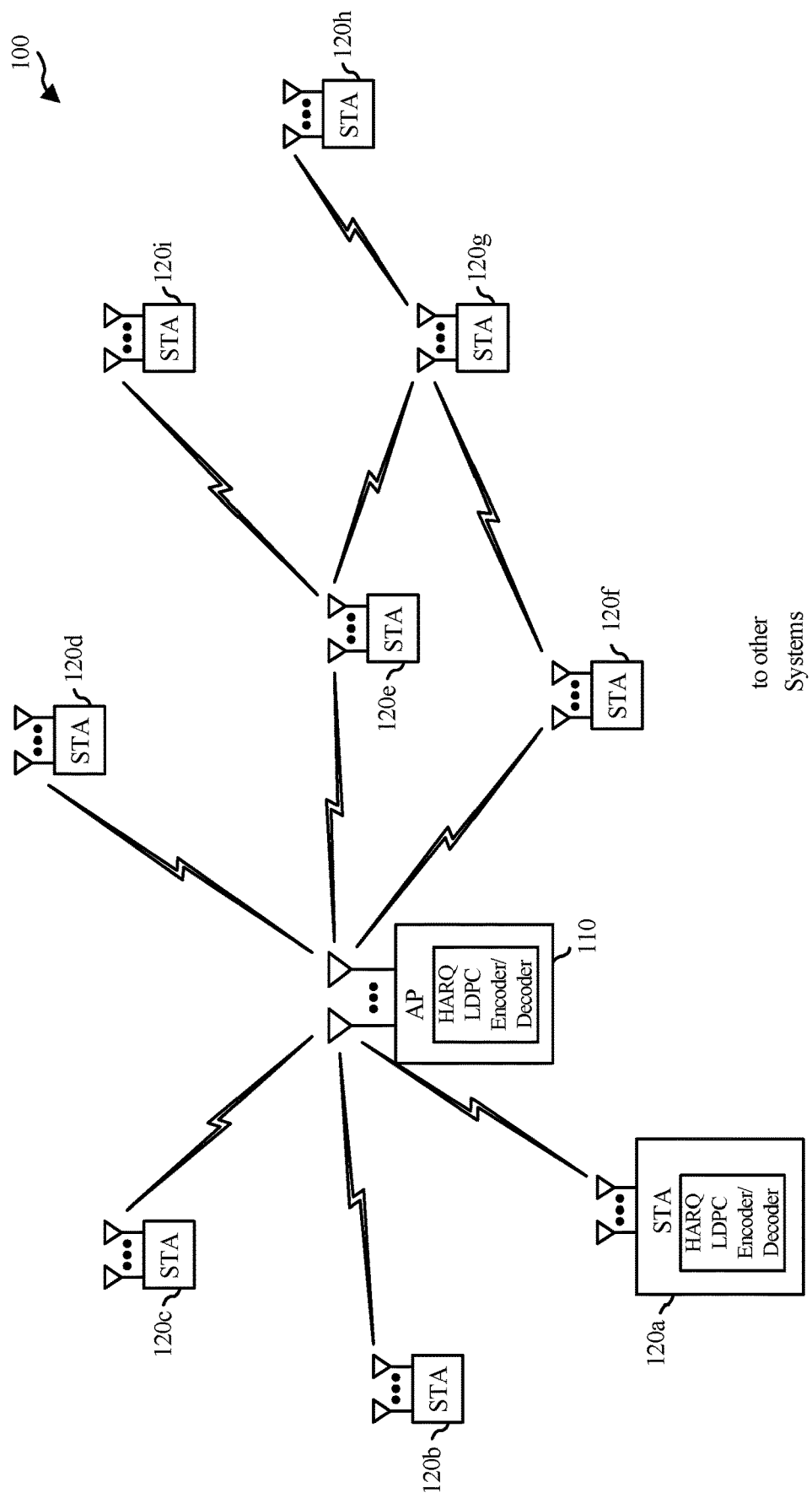
FIG. 1 shows a system diagram of an example network in which one or more aspects of the subject matter described in this disclosure can be implemented.

The following description is directed to certain implementations for the purposes of describing the innovative aspects of this disclosure. However, a person having ordinary skill in the art will readily recognize that the teachings herein can be applied in a multitude of different ways. Some of the examples in this disclosure are based on wireless and wired local area network (LAN) communication according to the Institute of Electrical and Electronics Engineers (IEEE) 802.11 wireless standards, the IEEE 802.3 Ethernet standards, and the IEEE 1901 Powerline communication (PLC) standards. However, the described implementations may be implemented in any device, system or network that is capable of transmitting and receiving RF signals according to any of the wireless communication standards, including any of the IEEE 802.11 standards, the Bluetooth® standard, code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless, cellular or internet of things (IOT) network, such as a system utilizing 3G, 4G or 5G, or further implementations thereof, technology.

As the demand for high speed WLAN and mobile broadband access continues to increase, there exists a need for further improvements in wireless technology. Preferably, these improvements should be applicable to a range of technologies and the telecommunication standards that employ these technologies. One area for improvements is the area of encoding/decoding, applicable to (WLAN) systems that operate according to the 802.11 family of standards, such as 802.11ax and 802.11be.

Communication systems often need to operate at several different rates. In some implementations, adjustable low-density parity-check (LDPC) codes can be used to provide coding and decoding at different rates. For example, higher-rate LDPC codes can be generated by puncturing lower-rate LDPC codes.

Puncturing generally refers to the act of removing bits from a code word to yield a shorter code word. In the context of LDPC encoding, puncturing removes some parity bits from the codeword and shortens the codeword. This generally results in fewer parity checks for the information bits sent in the codeword.

One or more innovative aspects of the subject matter described in this disclosure can help enhance transmission and reception of codewords between devices in a wireless network using low density parity check (LDPC) codes to generate codewords with information bits (such as bits of a message) and parity bits to use for error correction. Codewords for an initial transmission and a retransmission may be generated using different LDPC encoding processes. For example, the different encoding processes may use different LDPC encoding, different puncturing, different repetition, or a combination thereof.

Particular implementations of the subject matter described in this disclosure can be implemented to realize one or more of the following potential advantages. For example, the use of LDPC codes with different code rates may help achieve different throughput requirements. Further, the use of selective puncturing for hybrid automatic retransmission requests (HARQ) initial transmissions and retransmissions may allow for incremental redundancy to increase reliability of decoding at the receiver. HARQ allows a receiver to combine an initial failed packet and subsequent retransmission(s) to improve decoding performance.

The teachings herein may be incorporated into (such as implemented within or performed by) a variety of wired or wireless apparatuses (such as nodes). In some aspects, a wireless node implemented in accordance with the teachings herein may include an access point (AP) or a (non-AP) station (STA). A STA may include, be implemented as, or known as an access terminal (AT), a subscriber station, a subscriber unit, a mobile station, a remote station, a remote terminal, a user terminal (UT), a user agent, a user device, user equipment, a user station, or some other terminology. In some implementations, an access terminal may include a cellular telephone, a cordless telephone, a Session Initiation Protocol (SIP) phone, a wireless local loop (WLL) station, a personal digital assistant (PDA), a handheld device having wireless connection capability, a Station (STA), or some other suitable processing device connected to a wireless modem. Accordingly, one or more aspects taught herein may be incorporated into a phone (such as a cellular phone or smart phone), a computer (such as a laptop), a portable communication device, a portable computing device (such as a personal data assistant), an entertainment device (such as a music or video device, or a satellite radio), a global positioning system device, or any other suitable device that is configured to communicate via a wireless or wired medium. In some aspects, the node is a wireless node. Such wireless node may provide, for example, connectivity for or to a network (such as a wide area network such as the Internet or a cellular network) via a wired or wireless communication link.

FIG. 1 shows a system diagram of an example network 100 in which one or more aspects of the subject matter described in this disclosure can be implemented. For example, an AP 110 and a STA 120*a* may each include a HARQ LDPC encoder/decoder module capable of performing operations described below with reference to FIGS. 8 and 9.

For simplicity, only one access point 110 is shown in FIG. 1. An access point (AP) is generally a fixed station that communicates with one or more STAs 120.

The access point 110 may communicate with one or more STAs 120 at any given moment on the downlink and uplink. The downlink (i.e., forward link) is the communication link from the access point to the user terminals, and the uplink (i.e., reverse link) is the communication link from the user terminals to the access point. A STA also may communicate peer-to-peer with another user terminal.

The network 100 may employ multiple transmit and multiple receive antennas for data transmission on the downlink and uplink. The access point 110 is equipped with a number $N_{ap}$ of antennas and represents the multiple-input (MI) for downlink transmissions and the multiple-output (MO) for uplink transmissions. A set $N_u$ of selected user terminals 120 collectively represents the multiple-output for downlink transmissions and the multiple-input for uplink transmissions. In some implementations, it may be desirable to have $N_{ap} \geq N_u \geq 1$ if the data symbol streams for the $N_u$ user terminals are not multiplexed in code, frequency or time by some means. $N_u$ may be greater than $N_{ap}$ if the data symbol streams can be multiplexed using different code channels with CDMA, disjoint sets of sub-bands with orthogonal frequency division multiplexed (OFDM), and so on. Each selected user terminal transmits user-specific data to and receives user-specific data from the access point. In general, each selected user terminal may be equipped with one or multiple antennas (i.e., $N_{ut} \geq 1$). The $N_u$ selected user terminals can have the same or different number of antennas.

The network 100 may be a time division duplex (TDD) system or a frequency division duplex (FDD) system. For a TDD system, the downlink and uplink share the same frequency band. For an FDD system, the downlink and uplink use different frequency bands. The network 100 also may utilize a single carrier or multiple carriers for transmission. Each user terminal may be equipped with a single antenna (such as in order to keep costs down) or multiple antennas (such as where the additional cost can be supported). The network 100 may represent a high speed Wireless Local Area Network (WLAN) operating in a 60 GHz band.

Figure 2:
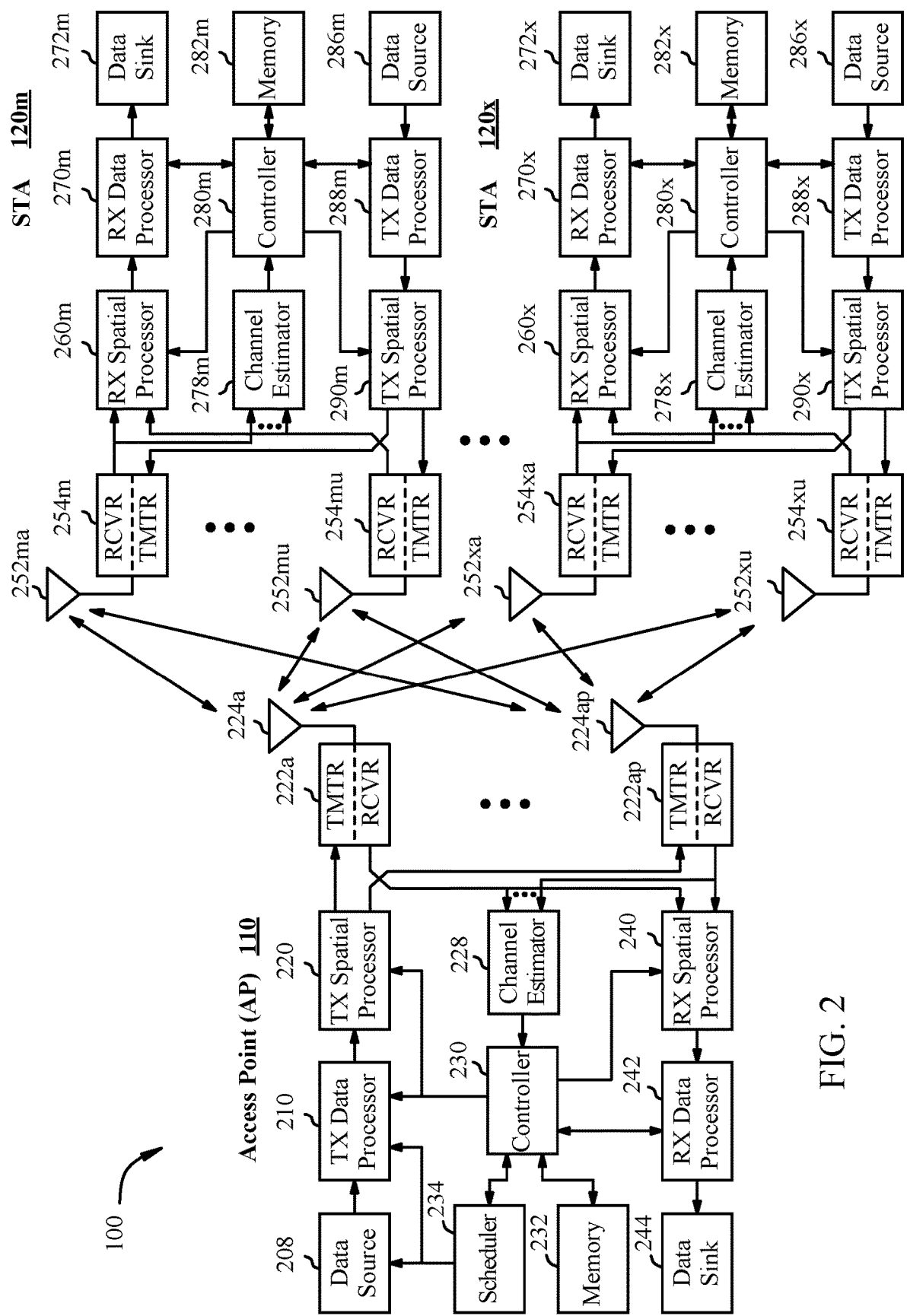
FIG. 2 shows a block diagram of example devices shown in FIG. 1.

FIG. 2 illustrates example components of the access point 110 and STA 120 illustrated in FIG. 1, which may be used to implement aspects of the present disclosure. One or more components of the access point 110 and station 120 may be used to practice aspects of the present disclosure. For example, antenna 224, transmitter/receiver unit 222, processors 210, 220, 240, 242, and/or controller 230 or antenna 252, transmitter/receiver 254, processors 260, 270, 288, and 290, and/or controller 280 may be used to perform the operations described herein and illustrated with reference to FIGS. 9 and 10.

FIG. 2 shows a block diagram of the access point/base station 110 and two STAs 120m and 120x in a MIMO system 100. The access point 110 is equipped with $N_{ap}$ antennas 224a through 224ap. The STA 120m is equipped with $N_{ut,m}$ antennas 252ma through 252mu, and the STA 120x is equipped with $N_{ut,x}$ antennas 252xa through 252xu. The access point 110 is a transmitting entity for the downlink and a receiving entity for the uplink. Each STA 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ STAs are selected for simultaneous transmission on the uplink, and NA STAs are selected for simultaneous transmission on the downlink. Moreover, $N_{up}$ may or may not be equal to Nan, and $N_{up}$, and $N_{dn}$ may include static values or can change for each scheduling interval. Beamforming (such as beamsteering) or some other spatial processing techniques may be used at the access point and STA.

On the uplink, at each STA 120 selected for uplink transmission, a TX data processor 288 receive traffic data from a data source 286 and control data from a controller 280. The controller 280 may be coupled with a memory 282. The TX data processor 288 processes (such as encodes, interleaves, and modulates) the traffic data $\{d_{up,m}\}$ for the STA based on the coding and modulation schemes associated with the rate selected for the STA and provides a data symbol stream $\{s_{up,m}\}$. A TX spatial processor 290 performs spatial processing on the data symbol stream $\{s_{up,m}\}$ and provides $N_{ut,m}$ transmit symbol streams for the $N_{ut,m}$ antennas. Each transmitter unit (TMTR) 254 receives and processes (such as converts to analog, amplifies, filters, and frequency upconverts) a respective transmit symbol stream to generate an uplink signal. The $N_{ut,m}$ transmitter units 254 provide $N_{ut,m}$ uplink signals for transmission from the $N_{ut,m}$ antennas 252 to the access point 110.

A number $N_{up}$ of STAs may be scheduled for simultaneous transmission on the uplink. Each of these STAs performs spatial processing on its data symbol stream and transmits its set of transmit symbol streams on the uplink to the access point.

At the access point 110, the $N_{up}$ antennas 224a through 224ap receive the uplink signals from all $N_{up}$ STAs transmitting on the uplink. Each antenna 224 provides a received signal to a respective receiver unit (RCVR) 222. Each receiver unit 222 performs processing complementary to that performed by the transmitter unit 254 and provides a received symbol stream. An RX spatial processor 240 performs receiver spatial processing on the $N_{ap}$ received symbol streams from the $N_{ap}$ receiver units 222 and provides $N_{up}$ recovered uplink data symbol streams. The receiver spatial processing is performed in accordance with the channel correlation matrix inversion (CCMI), minimum mean square error (MMSE), successive interference cancellation (SIC), or some other technique. Each recovered uplink data symbol stream $\{s_{up,m}\}$ is an estimate of a data symbol stream $\{s_{up,m}\}$ transmitted by a respective STA. An RX data processor 242 processes (such as demodulates, de-interleaves, and decodes) each recovered uplink data symbol stream $\{s_{up,m}\}$ in accordance with the rate used for that stream to obtain decoded data. The decoded data for each STA may be provided to a data sink 244 for storage and a controller 230 for further processing.

On the downlink, at the access point 110, a TX data processor 210 receives traffic data from a data source 208 for NA STAs scheduled for downlink transmission, control data from a controller 230, and possibly other data from a scheduler 234. The various types of data may be sent on different transport channels. The TX data processor 210 processes (such as encodes, interleaves, and modulates) the traffic data for each STA based on the rate selected for that STA. The TX data processor 210 provides NA downlink data symbol streams for the $N_{dn}$ STAs. A TX spatial processor 220 performs spatial processing on the $N_{dn}$ downlink data symbol streams, and provides $N_{ap}$ transmit symbol streams for the $N_{ap}$ antennas. Each transmitter unit (TMTR) 222 receives and processes a respective transmit symbol stream to generate a downlink signal. The $N_{ap}$ transmitter units 222 provide $N_{ap}$ downlink signals for transmission from the $N_{ap}$ antennas 224 to the STAs. The decoded data for each STA may be provided to a data sink 272 for storage and/or a controller 280 for further processing.

At each STA 120, the $N_{ut,m}$ antennas 252 receive the $N_{ap}$ downlink signals from the access point 110. Each receiver unit (RCVR) 254 processes a received signal from an associated antenna 252 and provides a received symbol stream. An RX spatial processor 260 performs receiver spatial processing on $N_{ut,m}$ received symbol streams from the $N_{ut,m}$ receiver units 254 and provides a recovered downlink data symbol stream $\{s_{dn,m}\}$ for the STA. The receiver spatial processing can be performed in accordance with the CCMI, MMSE, or other known techniques. An RX data processor 270 processes (such as demodulates, de-interleaves, and decodes) the recovered downlink data symbol stream to obtain decoded data for the STA.

At each STA 120, the $N_{ut,m}$ antennas 252 receive the $N_{ap}$ downlink signals from the access point 110. Each receiver unit (RCVR) 254 processes a received signal from an associated antenna 252 and provides a received symbol stream. An RX spatial processor 260 performs receiver spatial processing on $N_{ut,m}$ received symbol streams from the $N_{ut,m}$ receiver units 254 and provides a recovered downlink data symbol stream $\{s_{dn,m}\}$ for the STA. The receiver spatial processing is performed in accordance with the CCMI, MMSE, or some other technique. An RX data processor 270 processes (such as demodulates, de-interleaves, and decodes) the recovered downlink data symbol stream to obtain decoded data for the STA.

Figure 3:
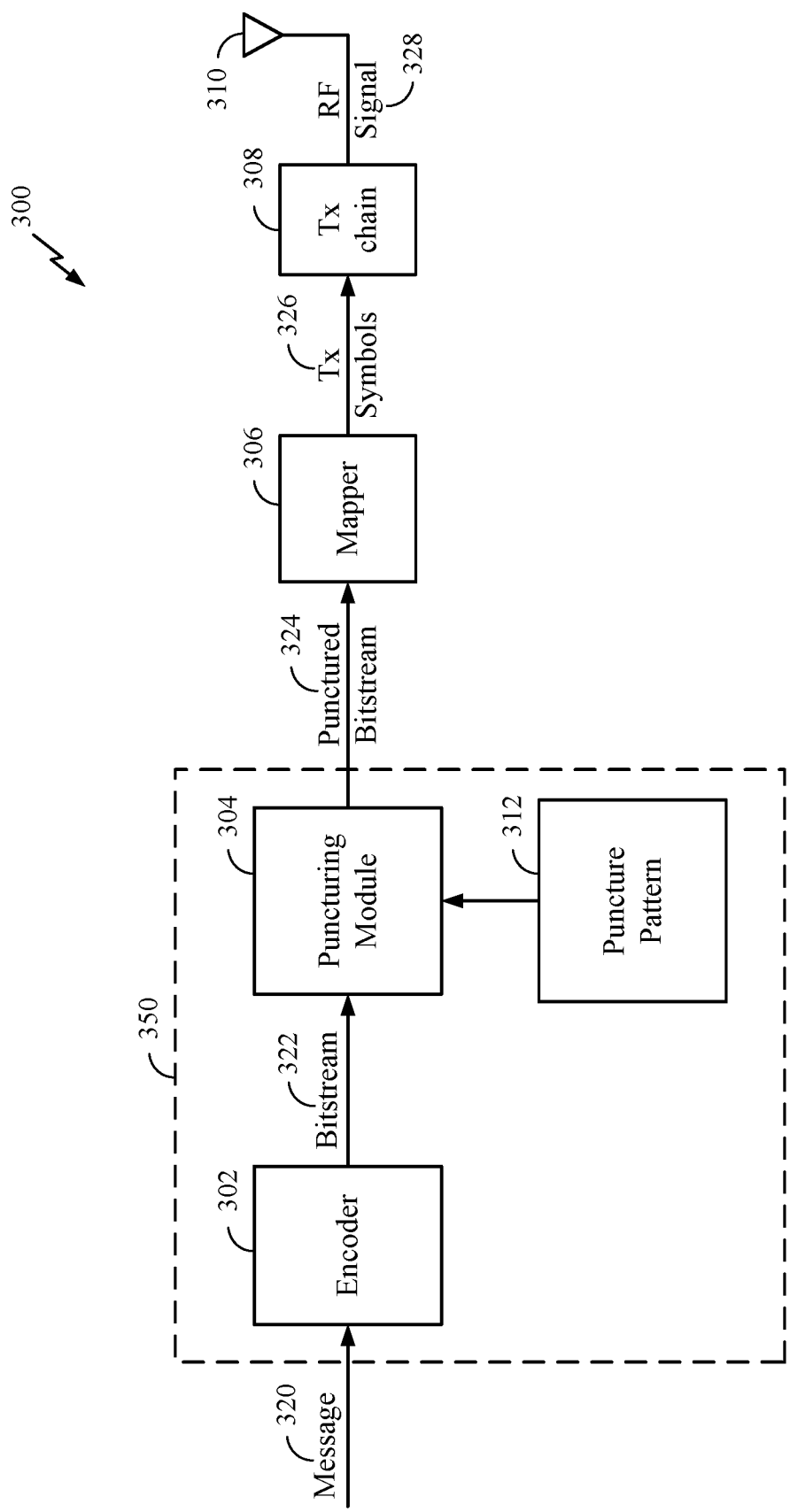
FIG. 3 shows a schematic diagram of an example encoder.

FIG. 3 is a simplified block diagram 300 illustrating an encoder portion of radio frequency (RF) modem 350 that may be configured to provide a signal including an encoded message for wireless transmission. In one example, convolutional encoder 302 in an AP 110 (or a STA 120 on the reverse path) receives message 320 for transmission. Message 320 may contain data or encoded voice or other content directed to the receiving device. Encoder 302 encodes the message using a suitable modulation and coding scheme (MCS), typically selected based on a configuration defined by the AP 110 or another network entity. Encoded bit stream 322 produced by encoder 302 may then be selectively punctured by puncturing module 304, which may be a separate device or component, or which may be integrated with encoder 302. Puncturing module 304 may determine that the bit stream should be punctured prior to transmission or transmitted without puncturing. The decision to puncture bit stream 322 may be made based on network conditions, network configuration, RAN defined preferences, or for other reasons. Bit stream 322 may be punctured according to puncturing pattern 312 and used to encode message 320. Puncturing pattern 312 may be based on LDPC code designs as described in more detail below. Puncturing module 304 provides output 324 to mapper 306 that generates a sequence of Tx symbols 326 that are modulated, amplified and otherwise processed by Tx chain 308 to produce RF signal 328 for transmission through antenna(s) 310.

Output 324 of puncturing module 304 may be the unpunctured bit stream 322 or a punctured version of bit stream 322, according to whether modem portion 350 is configured to puncture bit stream 322. In one example, parity or other error correction bits may be punctured in output 324 of encoder 302 in order to transmit message 320 within a limited bandwidth of the RF channel. In another example, bit stream 322 may be punctured to reduce the power needed to transmit message 320, to avoid interference, or for other network-related reasons. These punctured code word bits are not transmitted.

The decoders and decoding algorithms used to decode LDPC code words operate by exchanging messages within the graph along the edges and updating these messages by performing computations at the nodes based on the incoming messages. Each variable node in the graph is initially provided with a soft bit, termed a received value, that indicates an estimate of the associated bit's value as determined by observations from, for example, the communications channel. Ideally, the estimates for separate bits are statistically independent. This ideal may be violated in practice. A received code word is included of a collection of received values.

Figure 4:
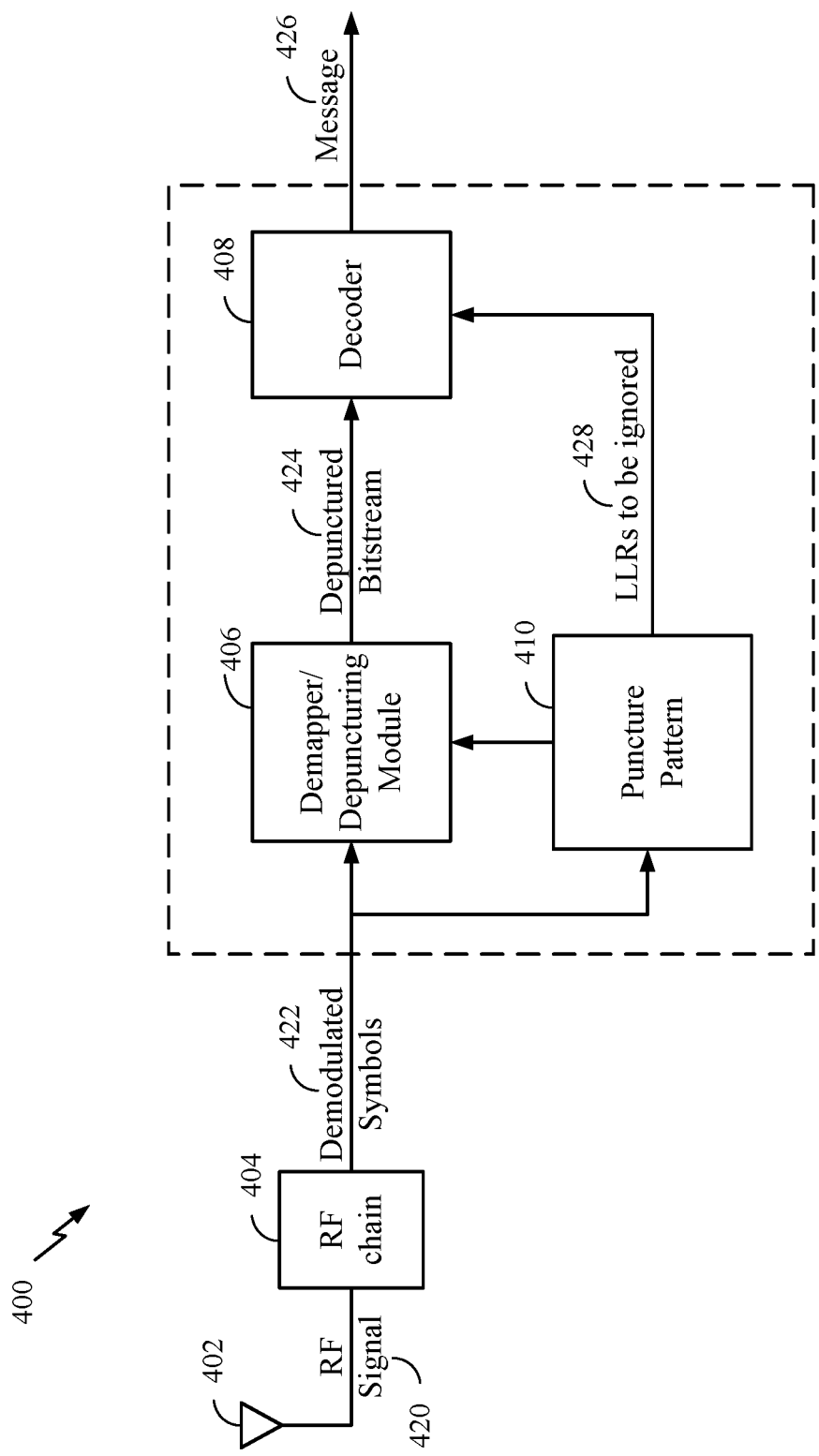
FIG. 4 shows a schematic diagram of an example decoder.

FIG. 4 is a simplified schematic 400 illustrating a decoder portion of RF modem 450 that may be configured to receive and decode a wirelessly transmitted signal including a punctured encoded message. The punctured (unsent) code word bits may be treated as erased. For example, decoding may involve setting the log likelihood ratios (LLRs) of the punctured nodes to "0" at initialization. De-puncturing also may include deshortening of shortened bits. These shortened bits are not included in a transmission and, at the receiver, shortened bits are treated as known bits, typically set to "0", allowing LLR magnitude to be set to the maximum possible. In various examples, modem 450 receiving the signal may reside at the access terminal (such as a STA 120), at the base station (such as AP 110), or at any other suitable apparatus or means for carrying out the described functions. Antenna 402 provides an RF signal 420 to the receiver. RF chain 404 processes and demodulates RF signal 420 and may provide a sequence of symbols 422 to demapper 406, which produces bit stream 424 representative of the encoded message (such as message 320).

Demapper 406 may provide a depunctured bit stream 424. In one example, demapper 406 may include a depuncturing module that can be configured to insert null values at locations in the bit stream at which punctured bits were deleted by the transmitter. The depuncturing module may be used when puncture pattern 410 used to produce the punctured bit stream at the transmitter is known. Puncture pattern 410 can be used to identify LLRs 428 that may be ignored during decoding of bit stream 424 by convolutional decoder 408. The LLRs may be associated with a set of depunctured bit locations in bit stream 424. Accordingly, decoder 408 may produce decoded message 426 with reduced processing overhead by ignoring identified LLRs 828. The LDPC decoder may include a plurality of processing elements to perform the parity check or variable node operations in parallel. For example, when processing a code word with lifting size Z, the LDPC decoder may utilize a number (Z) of processing elements to perform parity check operations on all edges of a lifted graph, concurrently.

Processing efficiency of decoder 408 may be improved by configuring the decoder 408 to ignore LLRs 428 that correspond to punctured bits in a message transmitted in punctured bit stream 424. Punctured bit stream 424 may have been punctured according to a puncturing scheme that defines certain bits to be removed from an encoded message. In one example, certain parity or other error-correction bits may be removed. A puncturing pattern may be expressed in a puncturing matrix or table that identifies the location of bits to be punctured in each message. A puncturing scheme may be selected to reduce processing overhead used to decode message 426 while maintaining compliance with data rates on the communication channel or with transmission power limitations set by the network. A resultant punctured bit stream typically exhibits the error-correcting characteristics of a high rate error-correction code, but with less redundancy. Accordingly, puncturing may be effectively employed to reduce processing overhead at decoder 408 in the receiver when channel conditions produce a relatively high signal to noise ratio (SNR).

At the receiver, the same decoder used for decoding non-punctured bit streams can typically be used for decoding punctured bit streams, regardless of how many bits have been punctured. In conventional receivers, the LLR information is typically de-punctured before decoding is attempted by filling LLRs for punctured states or positions (de-punctured LLRs) with zeros. The decoder may disregard de-punctured LLRs that effectively carry no information based in part, on what bits are punctured. The decoder may treat shortened bits as known bits (such as set to "0").

As will be described in greater detail below, in some cases, extended LDPC codes may be used to add an increased number of parity bits, relative to a base code.

Figure 5:
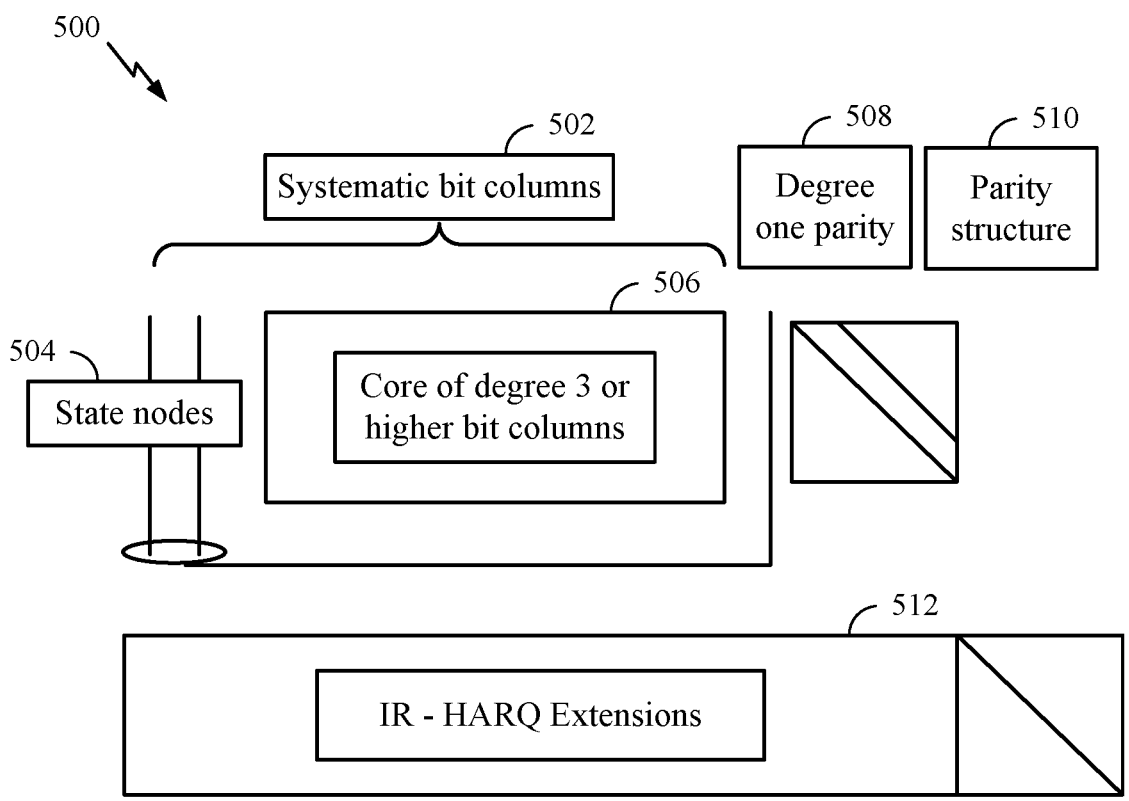
FIG. 5 shows an example extended parity check matrix (PCM).

FIG. 5 shows a structure of an example base parity check matrix PCM 500 corresponding to an extended LDPC code, in accordance with certain aspects of the present disclosure. As shown in FIG. 6, the example base PCM 500 has information (systematic) bit columns 502 (i.e., variable nodes) which include a "core" structure 506 of some number of degree 3 or higher variable nodes along with some state (punctured) nodes 504 that are of higher degree, which together form the set of information bit columns 502. For simplicity of description, all of the systematic bit columns other than the high degree punctured state nodes are degree 3, but the disclosed techniques are not so limited.

As shown in FIG. 5, the base PCM 500 structure includes a parity structure 510. The parity structure 510 includes an accumulate chain terminated by a degree 3 node (such as similar to the IEEE 802.11n standard LDPC code). Alternate encoding structures may be used, for example to support deeper error floors, and the disclosed techniques may be applied to such variations on the encoding structure. As shown in FIG. 6, the base PCM 500 structure also may include one or more degree one parity bits 508. The degree one parity bits 508 are connected via a check node only to the state nodes.

The bit columns 502 and parity structure 510 may be referred to as the "core graph" or "core PCM". As shown in FIG. 6, the core graph can be extended using additional parity-bits further IR-HARQ transmissions (IR-HARQ extensions 512) to define codes of a lower code rate than the rate associated to the core graph. The complete graph or some portion beyond the core graph may be referred to as an "extended graph". The core graph has an associated code rate determined by its parameters (i.e., variable nodes, check nodes, edges, puncturing, etc.). Some parity bits in the core graph can be punctured to support code rates above the code rate of the core graph. Lower coding rates may be obtained by extending the core graph with parity bits.

Early WiFi standards (such as up to 802.11ax) have implemented automatic repeat request (ARQ), but not hybrid ARQ. As a result, failed packets are not stored for combining purposes with retransmission(s). HARQ represents a possible physical (PHY) layer improvement in extended high throughput (EHT) relative to PHY layers current in (such as 802.11ax). Although this disclosure uses various examples that refer to 802.11ax for explaining certain innovative aspects and certain implementations, the techniques disclosed herein also may be applicable for other standards. For example, the techniques disclosed herein may be applicable for 802.11be and further 802.11 standards.

HARQ combines initial failed packet and subsequent retransmission(s) to improve decoding performance. As a result, HARQ may help achieve diversity gain, and may be used to enhance link performance in scenarios such as fast fading, interference, Doppler, or frequency allocation (through RU allocation or different interleaving). It also may achieve rate adaptation gain and may be used for throughput enhancement by enabling aggressive MCS.

As shown in FIG. 6, HARQ combining techniques include Chase combining (CC) and incremental redundancy (IR). HARQ with Chase combining often has relatively low efficiency, as there are no new parity bits in retransmissions. Aspects of the present disclosure propose techniques for LDPC encoding and decoding that may be applied with the more efficient HARQ with IR (IR-HARQ). Some implementations of the present disclosure provide new LDPC designs that may help enable IR-HARQ.

Figure 7:
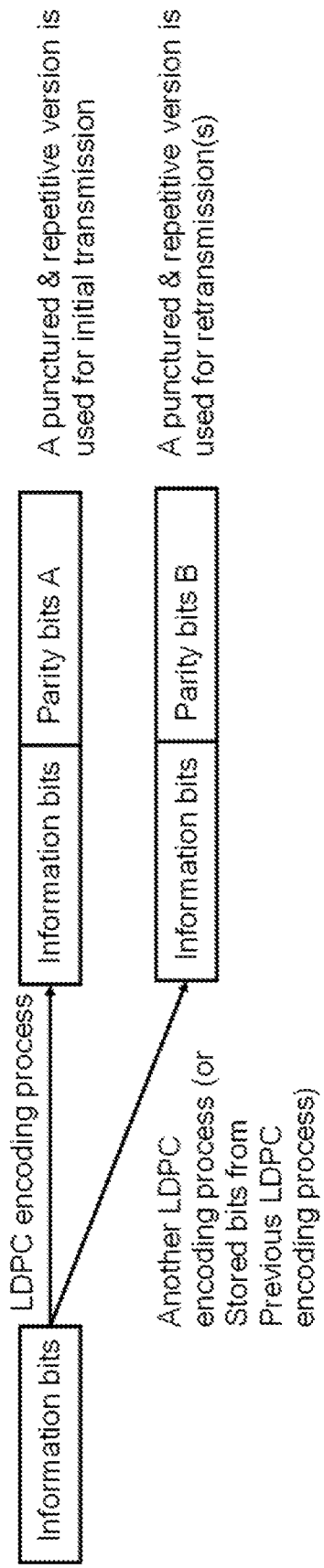
FIG. 7 shows example HARQ encoding techniques.

FIG. 7 shows an example LDPC-based HARQ encoding technique, in accordance with certain aspects of the present disclosure. As illustrated, if one codeword (with information bits and a first set of parity bits A generated by a first LDPC encoding process) in the initial transmission fails, a second LDPC encoding process resulting in the same information bits of this codeword (possibly with same scrambling) may be used to generate a second set of parity bits B in a retransmission(s) of the codeword. In some cases, the second LDPC encoding process may operate on information bits generated in the first LDPC encoding process (such as stored information bits). In each re-transmission, different bits may be included. For example, one retransmission could send only partial information bits and partial parity bits of each codeword, while another retransmission could send only some parity bits of each codeword, without sending any information bits at all.

802.11ax utilizes 12 different parity check matrices H for 4 coding rates (½, ⅔, ¾, ⅚) and 3 codeword sizes (648, 1296, 1944). Aspects of the present disclosure may extend LDPC to enable (partial) IR-HARQ. This may be accomplished by the use of one or more of additional codeword sizes, additional decoder modes (with a mode generally referring to a codeword size and code rate combination), and changes to LDPC encoding processes.

The present disclosure addresses various related challenges, like how to calculate the number of codewords and divide the payload bits among codewords, how to fit coded bits into the (re)transmissions resource allocation (modulation order, number of subcarriers, number of spatial streams, number of OFDM symbols), and how to manage the HARQ buffer at the decoder.

Particular implementations of the subject matter described in this disclosure provide various design options for enabling LDPC based IR HARQ. For example, according to a first design option (referred to herein as Design option 1), same LDPC codes as used in 802.11ax may be used, but the puncturing step, repetition step (or both) in the LDPC encoding process may be modified to get different parity bits in retransmission(s).

According to a second design option (referred to herein as Design option 2), LDPC codes may be extended to allow for LDPC based IR HARQ. For either the first or second design option, various transmission parameters, such as QAM modulation, numbers of subcarriers (RU allocations), number of spatial streams, and the like in (re)transmission(s) could be the same or different.

Figure 8:
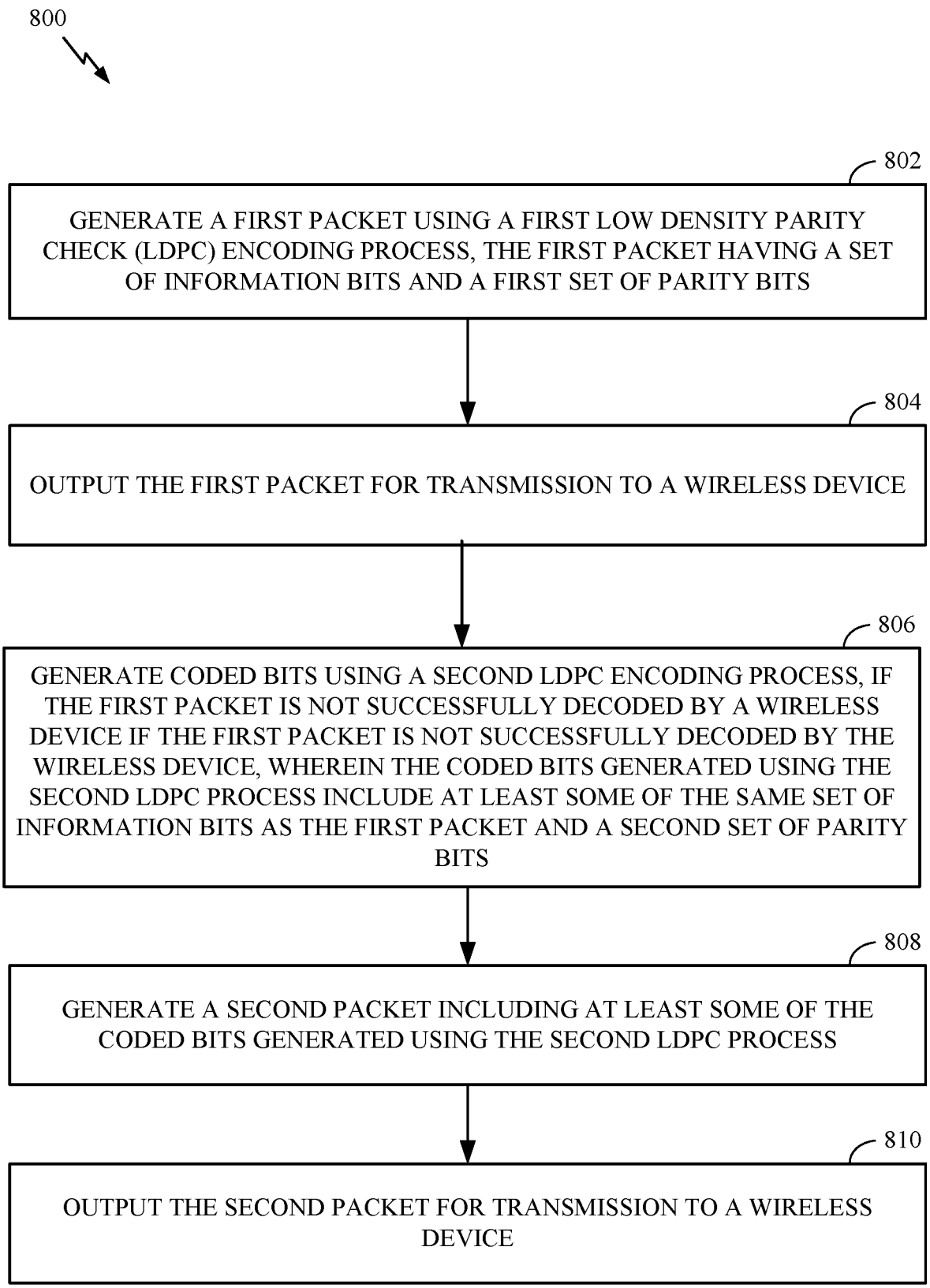
FIG. 8 shows a flow diagram of example operations for wireless communication.

FIG. 8 is a flow diagram of example operations 800 for wireless communications by an apparatus, in accordance with aspects of the present disclosure. The operations may be performed by a wireless device, such as an AP 110 or non-AP STA 120 of FIG. 1.

Operations 800 begin, at 802, by generating a first packet using a first low density parity check (LDPC) encoding process, the first packet having a set of information bits and a first set of parity bits. At 804, the apparatus outputs the first packet for transmission to a wireless device. At 806, the apparatus generates coded bits using a second LDPC encoding process if the first packet is not successfully decoded by the wireless device. The coded bits generated using the second LDPC process may include the same set of information bits as the first packet and a second set of parity bits. At 808, the apparatus generates a second packet including at least some of the information bits as the first packet and a second set of parity bits. At 810, the apparatus outputs the second packet for transmission to a wireless device.

Figure 9:
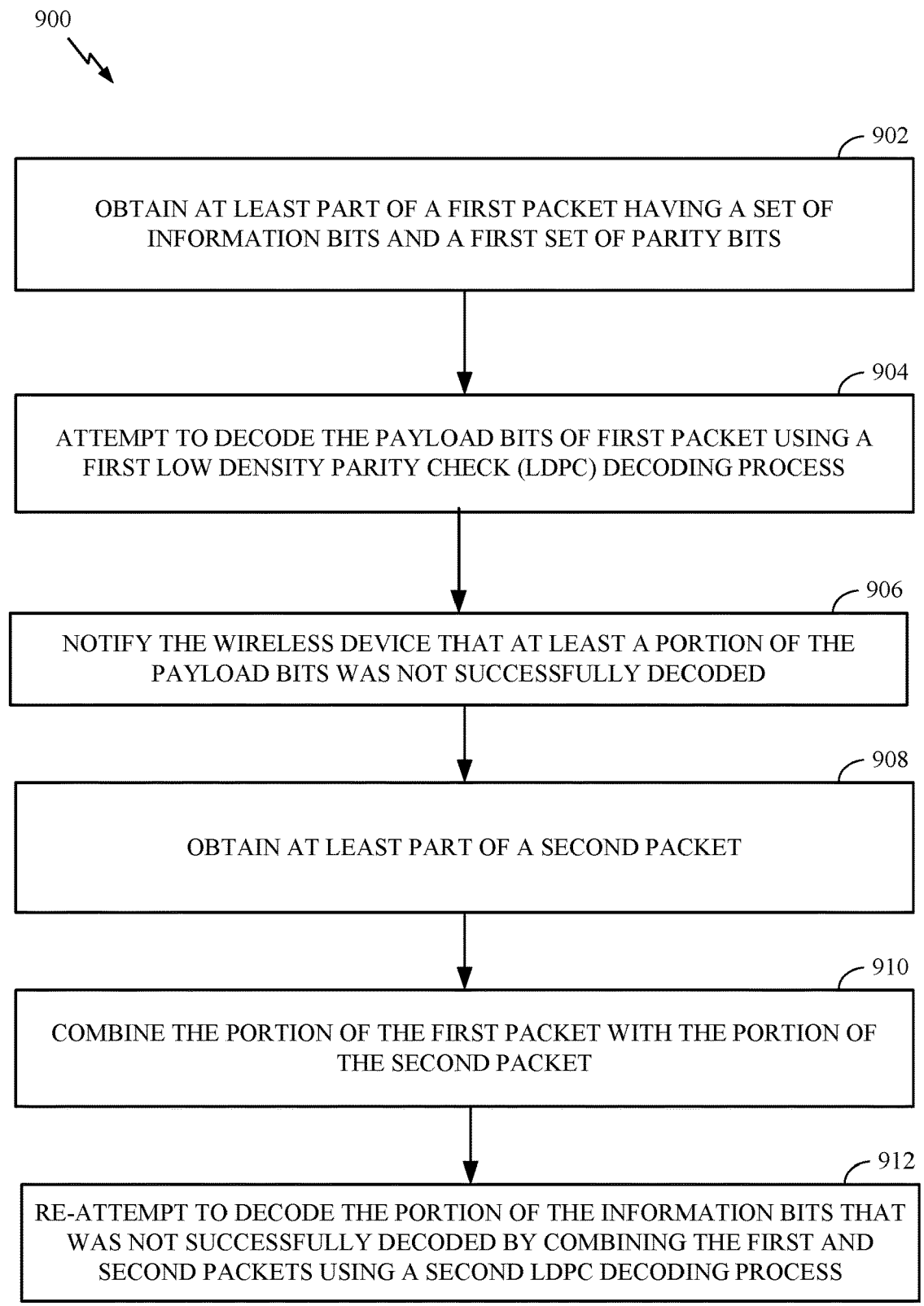
FIG. 9 shows a flow diagram of example operations for wireless communication.

FIG. 9 a flow diagram of example operations 900 for wireless communications by an apparatus, in accordance with aspects of the present disclosure. The operations may be performed by an apparatus, such as an AP 110 or non-AP wireless STA to decode transmissions sent from another device performing operations 9800 of FIG. 9 described above.

Operations 900 begin, at 902, by obtaining at least part of a first packet having a set of information bits and a first set of parity bits. At 904, the apparatus attempts to decode the payload bits of first packet using a first low density parity check (LDPC) decoding process. At 906, the apparatus notifies the wireless device that at least a portion of the information bits was not successfully decoded. At 908, the apparatus obtains at least part of a second packet. At 910, the apparatus combines the portion of the first packet with the portion of the second packet. At 912, the apparatus re-attempts to decode the portion of the information bits that was not successfully decoded based on combining first and second packets using a second LDPC decoding process. As noted above, according to Design Option 1, same LDPC codes as in 11ax may be used, but puncturing, repetition, or both puncturing and repetition steps in the LDPC encoding process may be modified to obtain different parity bits in retransmission(s).

With Design Option 1, initial transmissions may be performed as in flax. In each retransmission, the decoder may use the same LDPC encoder to generate same codewords as in the initial transmission (or use stored bits). The parity bits punctured and not sent in the initial transmissions may be considered ("incremental") additional parity bits. These additional parity bits along with possibly other coded bits sent in the previous (re)transmission(s) could be sent in retransmission(s). Design Option 1 may thus be implemented with relatively minor specification and encoder/decoder change without compromising performance.

The general idea of Design Option 2 is to use LDPC extension, which generally refers to a code extension for the LDPC code used in initial transmission to generate additional parity bits for retransmission(s). In such cases, the initial transmission may use a high rate LDPC code, for example, denoted by rate R1 and codeword size CW1. Given payload bits, a low rate "Mother" code, for example, denoted by rate R0 and codeword size CW0, could generate all parity bits that are generated by the high rate LDPC code in initial transmission, as well as some additional parity bits. The transmitted coded bits in each (re)transmission may be a punctured version of the codeword generated by the Mother code. FIG. 5 described above shows an example parity matrix extension that may be used for Design Option 2, with extension parity columns.

The following discussion may be based on one codeword, but the applications may be readily extended to multiple codewords, as will be described further below.

The following parameters may be assumed for a High rate LDPC code for initial transmission:

Payload bits: S (a 1×|S| vector); number of information bits: |S|

Parity bits: $\tilde{P}_{1,1}=P_1$ (a 1×|P$_1$| vector); number of parity bits: |P$_1$|

Codeword size: $CW_1=|S|+|P_1|$

Code rate:

$$R_1 = \frac{|S|}{CW_1}$$

The following parameters may be assumed for the Mother code:

Payload bits: S (a 1×|S| vector); number of payload bits: |S|

Parity bits: $P_0=[P_1, P_{AB}]$ (a 1×(|P$_1$|+|P$_{AB}$|) vector), where $P_{AB}$ are the additional parity bits generated by the mother code; number of additional parity bits: |P$_{AB}$|

Codeword size: $CW_0=|S|+|P_0|=|S|+|P_1|+|P_{AB}|$ $$R_0 = \frac{|S|}{CW_0}$$

Code rate:

The relationship between the high rate LDPC code for initial transmission and the mother code may be expressed as follows. The coded bits generated by the high rate LDPC code for initial transmission is a punctured version of the codeword generated by the mother code:

$R_1 \geq R_0$, $CW_1 \leq CW_0$

The 2nd transmission (the 1st retransmission after the initial transmission) may be as follows. It may be noted that each retransmission may not transmit all coded bits generated by the mother code. Coded bits transmitted in the 2nd transmission may be according to the following parameters:

Payload bits: $\tilde{S}_2$ is formed by concatenated one or multiple segments of payload bits in S; number of payload bits transmitted in the 2nd transmission: |S$_2$|;

Parity bits: $\tilde{P}_2=[\tilde{P}_{1,2}, \tilde{P}_{AB,2}]$;

$\tilde{P}_{1,2}$ is formed by concatenated one or multiple segments of parity bits transmitted in the initial transmission, i.e., P$_1$; number of old parity bits transmitted in the 2nd transmission: |$\tilde{P}_{1,2}$|;

$\tilde{P}_{AB,2}$ is formed by concatenated one or multiple segments of additional parity bits in $P_{AB}$; number of additional parity bits transmitted in the 2nd transmission: |$\tilde{P}_{AB,2}$|;

Total number of coded bits per codeword transmitted in the 2nd transmission:

$CW_2=|\tilde{S}_2|+|\tilde{P}_{1,2}|+|\tilde{P}_{AB,2}|$.

Given this, after two transmissions, the effective coding rate may be given as:

Effective code rate:

$$R_2 = \frac{|S|}{|S|+|P_1|+|\tilde{P}_{AB,2}|},$$

and $R_0 \leq R_2 \leq R_1$.

In the event of more retransmissions (such as the 2nd retransmission), the effective code rate could be determined in a similar manner.

For Design option 2 with LDPC Extension, the following Code Rate Assumptions may be made, given that 11ax has 4 coding rates {½, ⅔, ¾, ⅚}:

Assumption 1: An initial transmission uses an existing code rates, i.e., $R_1 \in \{½, ⅔, ¾, ⅚\}$;

Assumption 2: Retransmission(s) send additional parity bits generated by a mother code of lower rate, i.e., $R_1 \geq R_0$ (which leads to $CW_1 \leq CW_0$);

Assumption 3: All mother codes have a fixed code rate, such as $R_0=⅓$ or $R_0=½$.

There are various options for Codeword Size Options. According to a first option, Option 1, an initial transmission uses existing codeword sizes (such as $CW_1 \in \{648, 1296, 1944\}$) and uses existing LDPC codes. The mother codes have longer codewords, such as in the following examples:

If $R_0=1/3$, decoder needs 12 new modes (12 longer codewords where 10 are new);

If $R_0=1/2$, decoder needs 9 new modes (12 longer codewords where 9 are new).

According to an alternate of Option 1, Option 1a, suitable higher rate codes may be designed and extended to obtain codes of lower rates. For example, suitable rate ⅚ codes may be designed and extend each to get codes of lower rates (such as ½, ⅔, and ¾).

According to a second option for code block sizes, Option 2, the mother codes may use existing codeword sizes, such as $CW_0 \in \{648, 1296, 1944\}$. In this case, the initial transmission uses shorter codewords, such as in the following examples:

If $R_0=⅓$ the decoder uses 3 new modes (3 existing codeword sizes);

If $R_0=½$, decoder does not need new modes (3 existing codeword sizes), but in the case when $R_1=½$, the mother code does not generate additional parity bits.

In some cases, for Option 2, the performance of the initial transmission may be compromised. There exist alternates to Option 2, such as:

Option 2a: Design mother codes of lower rate and puncture each to get high rate codes for initial transmission; and Option 2b: On top of Option 2, only allow one mother codeword size of 1944 to further simplify decoder mode for HARQ.

For Design Option 2 with LDPC Extension, the decoder operation also may be according to various options, as illustrated in FIG. 10. According to a first decoder option, Option 1, an initial transmission uses existing codeword sizes, such as $CW_1 \in \{648, 1296, 1944\}$. According to a second decoder option, Option 2, the mother codes use existing codeword sizes, such as $CW_0 \in \{648, 1296, 1944\}$. While FIG. 10 does not show it, the Option 2 decoder could also process initial transmissions in the same manner as Option 1).

FIGS. 11-14 show example IR-HARQ encoding configurations based on different mother code rates.

FIG. 11 illustrates an example of LDPC Extension Option 1 With Rate 1/3 Mother Code. As illustrated, 4 coding rates R1 and 3 initial codeword sizes lead to 12 mother codeword sizes (10 of which may be considered new). In this example, there are 12 new decoder modes of (R0, CW0) due to new R0=1/3.

FIG. 12 illustrates an example of LDPC Extension Option 1 With Rate 1/2 Mother Code. In this example, 4 coding rates R1 and 3 initial codeword sizes result in 12 mother codeword sizes (9 of which may be considered new) and 9 new decoder modes of (R0, CW0) since R0=1/2 is an existing code rate.

FIG. 13 illustrates an example of LDPC Extension Option 2 With Rate 1/3 Mother Code. In this example, 4 coding rates R1 and 3 mother codeword sizes result in 12 initial codeword sizes (10 of which may be considered new) and 3 new decoder modes of (R0, CW0) due to new R0=1/3.

FIG. 14 illustrates an example of LDPC Extension Option 2 With Rate 1/2 Mother Code. In this example, 4 coding rates R1 and 3 mother codeword sizes result in 12 initial codeword sizes (9 of which may be considered new) and no new decoder modes of (R0, CW0) since R0=1/2 is an existing code rate. In this case, R1=1/2 does not have incremental redundancy (IR) as indicated by |P2|=0.

There are various options related to the encoding process, for example, regarding how to calculate the number of codewords and divide the payload bits among codewords, how to determine the (re)transmissions resource allocation (modulation order, number of subcarriers, number of spatial streams, number of OFDM symbols), and how to fit coded bits into the (re)transmissions resource allocation (modulation order, number of subcarriers, number of spatial streams, number of OFDM symbols).

Existing encoding processes may be modified according to various options to address these issues. For example, according to a first modification option, Modification Option 1 (with two Sub-options 1a and 1b), various parameters (such as codeword size, number of codewords, number of OFDM symbols, number of shortening bits, etc.) are first determined in the initial transmission. And then they are extended for these used in retransmission(s):

Sub-option 1a: Initial transmission LDPC encoding may be based on the high rate code (R1 & CW1);

Sub-option 1b: Initial transmission LDPC encoding may be based on the mother code (R0 & CW0) with puncturing of the additional parity bits to get high rate R1 and shorter codeword of size CW1.

As another example, according to a second modification option, Modification 2, parameters (such as codeword size, number of codewords, and number of shortening bits) are first determined based on the mother code. Codewords are then punctured for initial transmission or each retransmission, and packed into an integer number of OFDM symbols. In an initial transmission, the actual coding rate may not be the specified coding rate R1. In this case, LDPC encoding may always be based on the mother code (R0 & CW0).

There are various options for calculating the number of codewords and dividing the payload bits among codewords. In some cases, for an initial transmission, CW1 and number of codewords NCW1 may be determined similar to 11ax. For a given payload, a maximize codeword size (LDPC performance oriented) may be used provided the coded bits fit into an integer number of OFDM symbols, with the help of puncturing/repetition of coded bits. For retransmission(s), the number of codewords may be set as $N_{CW0}=N_{CW1}$ and in each codeword, the same information (payload) bits as in the initial transmission may be used to generate parity bits.

There are various options for fitting coded bits into the (re)transmissions resource allocation (modulation order, number of subcarriers, number of spatial streams, number of OFDM symbols). For an initial transmission, the following may be satisfied, similar to 11ax:

$$N_{TCB1}=N_{CBPS1}N_{SYM1}$$

where $N_{TCB1}$ is the total number of coded bits, $N_{CBPS1}$ is the number of coded bits per symbol, and $N_{SYM1}$ is the number of OFDM symbols. For Retransmission(s), mother codewords of size CW0 may be generated. Coded bits may then be punctured to fit into certain (pre-specified or estimated) resource allocation.

The code rate in each retransmission is not necessarily a given fractional number, as shown in FIG. 13 (for R0=1/3 and R1=5/6) and FIG. 14 (for R0=1/2 and R1=5/6). In such cases, retransmission(s) may not send payload bits or all of the additional parity bits. Analysis may be performed to identify a suitable puncturing pattern, for example, based on how many payload bits, old parity bits, and additional parity bits in retransmission(s), and how to puncture the mother codeword to obtain them.

For LDPC Encoding Process Modification Option 2, there are options for calculating the number of codewords and dividing the payload bits among codewords. In some cases, CW0 and the number of codewords $N_{CW0}$ may be determined and then mother codewords may be generated similar to 11ax but without the 11ax like puncturing or repetition. The rule may be, for given payload, to maximize codeword size (LDPC performance oriented). For an initial transmission, the number of codewords may be set as $N_{CW1}=N_{CW0}$ and in each mother codeword, the "additional parity bits" may be punctured to get codeword of size CW1. For retransmission(s), in each mother codeword, the coded bits including some "additional parity bits" may be punctured for transmission.

To fit coded bits into the (re)transmissions resource allocation (modulation order, number of subcarriers, number of spatial streams, number of OFDM symbols), mother codewords of size CW0 may be generated similar to 11ax but without the 11ax like puncturing or repetition. For the initial transmission, mother codewords may be punctured to satisfy:

$$N_{TCB1}=N_{CBPS1}N_{SYM1}$$

and the initial transmission may use an effective code rate not equal to R1. For retransmissions, mother codewords may be punctured to fit coded bits to into certain (pre-specified or estimated) resource allocation. As noted above, in such cases, the code rate in each retransmission is not necessarily a given fractional number. Retransmission(s) may not send payload bits or all of the additional parity bits. Again, analysis may be performed to identify good puncturing pattern (how many payload bits, old parity bits, and additional parity bits in retransmission(s), and how to puncture the mother codeword to get them).

There are various options for managing the decoder buffer at the receive side. According to a first design option, Design Option 1, the buffer size may be set as CW1, and decoder uses codeword size of CW1.

According to a second design option, Design Option 2 (LDPC extension), there are also options. According to one option, the initial transmission uses existing codeword sizes and there may be sub-options. According to a first sub-option, for the initial transmission, the buffer size is set as CW1, and the decoder uses codeword size of CW1, while for retransmission, the buffer size is increased to CW0, and the decoder uses codeword size of CW0. According to a second sub-option, the buffer may be set to CW0 and, for an initial transmission, the decoder may use codeword size of CW1 or CW0, while after retransmissions and combining, the decoder may use a codeword size of CW0. According to a second option, such as when the mother codes use existing codeword sizes, the buffer size may always be set as CW0, and the decoder uses codeword size of CW0.

The design options presented herein may have an impact on the ability of legacy receivers to decode transmitted packets. For Design Option 1, legacy receivers may decode the initial transmission, but may not decode the retransmissions. This should be acceptable, as there is no storage of first failed packet or combining of two packets at a legacy receiver anyway. For Design Option 2, for Options 1 and 2, legacy receivers may decode the initial transmission, but may not decode the retransmissions (and, again, there is no storage of first failed packet or combining of two packets at a legacy receiver).

Partial ACK/Retransmission or NACK/Retransmission may be implemented in certain manners, for example, to address how to do partial ACK/re-transmission when only certain codewords fail. According to a first option, ACK/NACK granularity may be that of a codeword. In this case, the ACK feedback may use a bitmap for ACK of all codewords and retransmission is only done for failed codewords and may include a bitmap of indication (if not, it follows ACK).

According to a second option, ACK/NACK granularity may be that of an MPDU. According to this option, ACK feedback may use a bitmap for ACK of all MPDUs and retransmission is only done for failed MPDUs and may include a bitmap of indication (if not, it follows ACK).

It may be noted that the set of codewords that need retransmission is a subset of the set of all codewords. Therefore, in various LDPC encoding process modifications proposed herein, in the retransmission processing, the following rules may apply:

Only encode the codewords that need retransmission;
Only count the codewords that need retransmission when packing coded bits into a certain number of OFDM symbols; and
No longer use $N_{CW0}$, but use another notation such as $N_{CW2}$ to denote the number of codewords in retransmission.

As described above, the ACK/NACK granularity may be a codeword, an MPDU, or a packet. In some cases, LDPC codewords and MAC protocol data unit (MPDU) or MAC service data unit (MSDU) boundaries are not aligned, such that one LDPC codeword may cover multiple MPDUs/MSDUs or an MPDU may span across multiple LDPC codewords. Therefore, if the granularity is an MPDU, in one failed MPDU, there could exist some LDPC codewords that are successfully decoded. However, if the NACK only indicates the failure of this MPDU, the transmitter will retransmit the entire MPDU, including the LDPC codewords that have been successfully decoded. On the other hand, if the granularity is an LDPC codeword, in one failed codeword, there could exist MPDUs that are successfully decoded. However, if the NACK only indicates the failure of this codeword, the transmitter will retransmit this codeword including the MPDUs that have been successfully decoded. Thus, having flexibility in ACK/NACK granularity may be beneficial.

As described above, for incremental redundancy, to form a codeword for HARQ, mother codewords may be strategically punctured for initial and re-transmissions. This selective puncturing is different than the puncturing step that occurs in conventional LDPC encoding, as this puncturing effectively selects certain information bits, parity bits, or both information and parity bits of the systematic codeword generated by the LDPC encoding. In other words, the puncturing may be applied to information bits, parity bits, or both.

Exactly how the puncturing is performed (to select which bits) may be based on performance analysis. Each codeword (for initial and retransmissions) may be considered a vector and the puncturing may be set up to select which bits are being punctured. Of course, the transmitter and receiver need to both know and use the same puncturing.

To implement the puncturing described above, a puncturing matrix G may be used to specify what bits to puncture (such as only parity bits, or both information bits and parity bits, etc.) and how to do puncturing (such as puncturing x bit(s) every y bits, etc.). In general, a $k^{th}$ codeword generated for initial transmission may be defined as:

$$c^{(k)'}=(i_0^{(k)},i_1^{(k)},\ldots,i_{CW_1 \cdot R_1-N_{shrt1,k}-1}^{(k)},p^{(k)}).$$

Note that due to the puncturing step in LDPC encoding process, the coded bits for initial transmission may not be all coded bits in this codeword. The $k^{th}$ mother codeword of dimension $1\times(CW_0-N_{shrt1,k})$ may be defined as:

$$c^{(k)'}=(i_0^{(k)},i_1^{(k)},\ldots,i_{CW_1 \cdot R_1-N_{shrt1,k}-1}^{(k)},p^{(k)},q^{(k)}).$$

The parity bits of the $k^{th}$ codeword generated for initial transmission may be defined as:

$$p^{(k)}=(p_0^{(k)},p_1^{(k)},\ldots,p_{CW_1 \cdot R_1(1-R_1)-1}^{(k)}).$$

while the additional parity bits of the $k^{th}$ mother codeword may be defined as:

$$q^{(k)}=(q_0^{(k)},q_1^{(k)},\ldots,q_{CW_0-CW_1-1}^{(k)}).$$

As noted above, a puncturing matrix G may be used to obtain a punctured version of the mother codeword. The punctured version of the $k^{th}$ mother codeword may be defined as:

transpose $(c_G^{(k)'})$=G·transpose $(c_M^{(k)'})$.

The dimension of the punctured version of the $k^{th}$ mother codeword is:

$1 \times N_b$, where $N_b \le CW_0-N_{shrt1,k}$ and the dimension of the puncturing matrix $G$ is:

$N_b \times (CW_0-N_{shrt1,k})$.

Each row of the puncturing matrix G has only one element being 1 and all other elements being 0, while each column has at most one element being 1 and all other elements being 0. The number of columns that have non-zero element(s) is $N_b$, which satisfies the equation:

$$GG^T = I_{N_b}.$$

The puncturing matrix may be used to discard (puncture) coded bits or switch the order of coded bits. The first $CW_1 \cdot R_1 - N_{shrt1,k}$ columns of G correspond to the information (payload) bits. Column $CW_1 \cdot R_1 N_{shrt1,k}+1$ to column $CW_1 - N_{shrt1,k}$ of G correspond to the parity bits generated for initial transmission, while Column $CW_1 - N_{shrt1,k}+1$ to column $CW_0 - N_{shrt1,k}$ of G correspond to the additional parity bits. The effective coding rate generally corresponds to the total number of 1's in the first $CW_1 - R_1 - N_{shrt1,k}$ columns of G divided by the total number of 1's in the rest of columns in G. In other words, the effective coding rate may be defined as:

$$\frac{\text{sum}(g(1:CW_1 \cdot R_1 - N_{shrt1,k}))}{\text{sum}(g(CW_1 \cdot R_1 - N_{shrt1,k}+1:CW_0 - N_{shrt1,k}))},$$

where $g = 1_{1 \times N_b} G$.

In the IR-HARQ design described herein, a puncturing matrix may be used to generate the codeword $c^{(k)}$ for initial transmission by puncturing the mother codeword $c_M^{(k)'}$ and to obtain the coded bits for retransmission(s) by puncturing the mother codeword) $c_M^{(k)}$. For the initial transmission (if encoding based on mother code), $c_M^{(k)'}$ may be punctured to get $c^{(k)'}$ based on:

$$G_1 = [I_{CW_1 - N_{shrt1,k}} \; 0_{(CW_1 - N_{shrt1,k}) \times (CW_0 - CW_1)}].$$

It may be noted that that in the puncturing step in the LDPC encoding process, the coded bits may be further punctured to fit into an integer number of OFDM symbols, for example, puncturing the last $N_{punc,1k}$ parity bits in $c^{(k)'}$ and the effective puncturing matrix:

$$G_1 = [I_{CW_1 - N_{shrt1,k} - N_{punc,1k}} \; 0_{(CW_1 - N_{shrt1,k} - N_{punc,1k}) \times (CW_0 - CW_1)}].$$

The effectively coding rate of initial transmission, in this case, equals:

$$\frac{(CW_1 \cdot R_1 - N_{shrt1,k})}{(CW_1 - N_{shrt1,k} - N_{punc,1k})}.$$

For retransmission, a puncturing matrix $G_2$ is used to obtain coded bits from mother codeword. There are $|\tilde{S}_2|$ 1's in the first $CW_1 \cdot R_1 - N_{shrt1,k}$ columns of $G_2$. There are $|\tilde{P}_{1,2}|$ 1's from column $CW_1 \cdot R_1 - N_{shrt1,k}+1$ to column $CW_1 - N_{shrt1,k}$ of $G_2$. There are $|\tilde{P}_{AB,2}|$ 1's from column $CW_1 - N_{shrt1,k}+1$ to column $CW_0 - N_{shrt1,k}$ of $G_2$. Thus, the effective coding rate of this retransmission equals:

$$\frac{|\tilde{S}_2|}{(|\tilde{S}_2| + |\tilde{P}_{1,2}| + |\tilde{P}_{AB,2}|)} = \frac{|\tilde{S}_2|}{N_b}.$$

The effective coding rate for the combined (initial and retransmission) may be found by defining parameters:

$$g_1 = 1_{1 \times (CW_1 - N_{shrt1,k} - N_{punc,1k})} G_1$$

$$g_2 = 1_{1 \times N_b} G_2, \text{ and}$$

$$g_{\mathit{eff}} = \text{OR}(g_1, g_2)$$

where $g_{\mathit{eff}}$ is the combined puncturing matrix, such that the effective coding rate equals:

$$\frac{\text{sum}(g_{\mathit{eff}}(1:CW_1 \cdot R_1 - N_{shrt1,k}))}{\text{sum}(g_{\mathit{eff}}(CW_1 \cdot R_1 - N_{shrt1,k}+1:CW_0 - N_{shrt1,k}))}.$$

As noted above, the puncturing matrix described above may be defined to achieve a certain desired puncturing ratio, for example, to puncture x bit(s) every y bits. The puncturing ratio (p_ratio), referring to the ratio of punctured bits to total bits before puncturing, may be expressed as a percentage (such as 10%, 15%, or 20%). The puncturing ratio may be further defined according to which type of bits to be punctured (such as only parity bits or both information and parity bits). The following are examples of possible puncturing patterns achieved by a puncturing matrix.

For a first example, parity bits only are punctured, and 1 (parity) bit is punctured for every 5 (parity) bits, resulting in a puncturing ratio:

$$p\_ratio = 20\%.$$

For a code rate $R = |S|/(|S|+|P|)$, puncturing only parity bits with p_ratio, means the effective code rate of this transmission alone becomes:

$$R\_eff = |S|/(|S|+|P|*(1-p\_ratio)) = 1/(1+(1-R*(1-p\_ratio)).$$

For a second example, both information and parity bits are punctured, puncturing 1 bit every 5 bits, again resulting in puncturing ratio:

$$p\_ratio = 20\%.$$

For a code rate $R = |S|/(|S|+|P|)$, puncturing both information and parity bits with p_ratio, means the effective code rate of this transmission alone becomes $R\_eff = |S|/(|S|+|P|*(1-p\_ratio))$, because even though some information bits are punctured, the coded bits still contain information of all information bits.

There are various options for the parity check matrix (PCM) for the techniques described herein. Various LDPC parity check matrices for different codeword sizes are already defined in certain standards. For example, IEEE 802.11n HT, Section 20.3.11.6.4 defines parity check matrices for codeword size of 648 (where Z=27), codeword size of 1296 (where Z=54), and codeword size of 1944 (where Z=81). There are 12 different parity check matrices H for 4 coding rates (R=½, ⅔, ¾, ⅚) and 3 codeword sizes (CW=648, 1296, 1944). The size of each parity check matrix is $CW(1-R) \times CW$.

For the techniques described herein, the mother code may use a parity matrix $H_M$ that is an expansion of the parity matrix H of the LDPC code in the initial transmission. Code rates may be related as $CW_1 \cdot R_1 = CW_0 \cdot R_0$, where:

$$H_M = \begin{bmatrix} H & A \\ B & E \end{bmatrix},$$

$H_M$ has dimensions of $CW_0 \cdot (1-R_1) \times CW_0$,

Sub-block A has dimensions of $CW_1 \cdot (1-R_1) \times (CW_0 - CW_1)$,

Sub-block B has dimensions of $(CW_0 - CW_1) \times CW_1$, and

Sub-block E has dimensions of $(CW_0 - CW_1) \times (CW_0 - CW_1)$.

As noted above, according to one design option (referred to above as design option 1), the LDPC parity check matrices for initial transmission and retransmission(s) are existing defined parity check matrices. This option uses an existing code for both the initial transmission and the retransmission, but modifies the puncturing and repetition step. In some cases, this may be considered Chase combining in a sense (such as if no new parity bits are included in the retransmission).

According to a second design option, referred to above as design Option 2 (or LDPC extension), different PCMs may be used for initial transmission and retransmission(s). In this option, the mother code actually has a larger PCM, for example, based on (expansion of) H of initial transmission.

In one case of this second design option, an initial transmission uses existing codeword sizes (such as $CW_1 \in \{648, 1296, 1944\}$). If the LDPC encoder/decoder in initial transmission is based on (R1, CW1), the LDPC parity check matrices may be the existing parity check matrices described above, of dimension $CW_1(1-R_1)$-by-$CW_1$. If the LDPC encoder/decoder in initial transmission is based on ($R_0$, $CW_0$) and the LDPC encoder/decoder in retransmission(s) is based on ($R_0$, $CW_0$), then each LDPC parity check matrix is a $CW_0(1-R_0)$-by-$CW_0$ matrix, where one of its sub-block (of dimension $CW_1(1-R_1)$-by-$CW_1$) is an existing parity check matrix described above.

In another case of this second design option, the mother codes use existing codeword sizes (such as $CW_0 \in \{648, 1296, 1944\}$). In this case, if the LDPC encoder/decoder in initial transmission is based on ($R_1$, $CW_1$), then each LDPC parity check matrix may be a sub-block (of dimension $CW_1(1-R_1)$-by-$CW_1$) of an existing parity check matrix described above and could be obtained by puncturing ($CW_0-CW_1$) rows and puncturing ($CW_0-CW_1$) columns from the last ($CW_0-CW_1*R_1$) columns. If the LDPC encoder/decoder in initial transmission is based on ($R_0$, $CW_0$) and the LDPC encoder/decoder in retransmission(s) is based on ($R_0$, $CW_0$), the LDPC parity check matrices may be the existing parity check matrices described above, of dimension $CW_0(1-R_0)$-by-$CW_0$.

When LDPC is used, in some cases, an indication may be provided if an extra LDPC symbol segment is used. In some cases, an extra symbol or symbol segment (such as one symbol may have 4 symbol segments) may be used if a puncturing ratio in the puncturing step of the conventional LDPC encoding process in WiFi would otherwise be too high, which would introduce performance degradation. The use of a symbol segment granularity may lead to more efficient resource use, particularly given the larger symbol duration of 802.11ax relative to 802.11ac, allowing an extra segment to be added rather than a whole symbol. This extra symbol or symbol segment generally means more subcarriers, corresponding to more available bits to spread the coded bits across, which lowers the puncturing ratio in the puncturing step of the conventional LDPC encoding process in WiFi.

The indication may be provided, for example, using an existing mechanism (such as an LDPC_extra_sym defined in 802.11ax), such as a bit in a signal field (such as SIG-A) in a packet header. At the transmitter, if an extra OFDM symbol segment is added to increase the total number of coded bits in the LDPC encoding process, to avoid too much puncturing in the puncturing step of the conventional LDPC encoding process for at least one user, the indication may be set to 1 (otherwise, the bit may be set to 0). At the receiver, the indication is used to determine the number of OFDM symbols and symbol segments before possibly adding an extra OFDM symbol segment (so that the receiver can figure out the PHY payload size, codeword size, etc.).

Use of the LDPC extra symbol segment indication may be illustrated considering the following two cases.

In a first case, LDPC Encoding Process Modification option 1, parameters are determined by $CW_1$ and $R_1$. In this case, for the initial transmission, the transmitter sets LDPC_extra_sym according to the encoding process, while the receiver uses LDPC_extra_sym to determine $CW_1$. For retransmission(s), the retransmission from a station may not result in an LDPC extra symbol segment, because the puncturing and repetition steps in the conventional LDPC encoding process may be replaced by the puncturing process to select coded bits for transmission. As such, the receiver determines $CW_0$ and PHY payload size based on $CW_1$, $R_1$ & $R_0$.

In a second case, LDPC Encoding Process Modification option 2, parameters are determined by $CW_0$ and $R_0$. In this case, the initial transmission may not result in an LDPC extra symbol segment. The receiver may determine the minimum number of coded bits per codeword based on the number of OFDM symbols and symbol segments and then determine $CW_0$. In this case, retransmission(s) of a station may not result in an LDPC extra symbol segment, because the puncturing and repetition steps in the conventional LDPC encoding process may be replaced by the puncturing process to select coded bits for transmission. As such, the receiver can use the same $CW_0$ as determined for the initial transmission.

Additional details are provided below for particular implementations of the LDPC encoding process according to design option 1. Various enumerated steps for an initial transmission and re-transmission via an SU PPDU and MU PPDU, according to design option 1 are described (although the step numbers do not necessarily imply a strict order in which the steps must be taken). As noted above, for design option 1, the initial transmission may be the same as in existing systems (such as according to flax. The following definitions may apply to the description that follows:

Number of bits in service field $N_{SERVICE}=16$, $N_{BPSCS1}$ is the modulation order, $N_{SD1}$ is the number of carriers in the RU, $N_{SS1}$ is the number of spatial streams, Number of coded bits per OFDM symbol in the RU $N_{CBPS1}=N_{BPSCS1}N_{SD1}N_{SS1}$, Number of data bits per OFDM symbol in the RU $N_{DBPS1}=N_{CBPS1}R_1$, $N_{SD1,SHORT}$ is defined in Table 28-30 (of the IEEE 802.11ax specification draft D4.0), $N_{DBPS1,SHORT}=N_{CBPS1,SHORT}R_1$, $N_{CBPS1,SHORT}=N_{BPSCS1}N_{SD1,SHORT}N_{SS1}$, $m_{STBC}$ is 2 if STBC is used, and 1 otherwise, and $$N_{SYM1,init} = m_{STBC}\left\lceil \frac{8 \times \text{APEP\_LENGTH} + \text{N\_SERVICE}}{m_{STBC}N_{DBPS1}} \right\rceil$$

is the initial number of data OFDM symbols in the data field.

A first step (step 1) is to calculate a number of initial pre-FEC padding bits, based on the following calculations. In an SU PPDU transmission, first compute the number of bits left in the last OFDM symbol(s) as $N_{Excess}=\text{mod}(8\times\text{APEP\_LENGTH}+N\_\text{SERVICE}, M_{STBC}N_{DBPS1})$, an initial number of symbol segments in the last OFDM symbol(s), a pre-FEC padding factor:

$$a_{init} = \begin{cases} 4, \text{ if } N_{Excess} = 0 \\ \min\left(\left\lceil \dfrac{N_{Excess}}{m_{STBC} N_{DBPS1,SHORT}} \right\rceil, 4\right) \end{cases},$$

otherwise
an initial number of data bits per symbol in the last OFDM symbol(s):

$$N_{DBPS1,LAST,init} = \begin{cases} a_{init} N_{DPBS1,SHORT}, \text{ if } a_{init} < 4 \\ N_{DBPS1}, \text{ if } a_{init} = 4 \end{cases},$$

and an initial number of coded bits per symbol in the last OFDM symbol(s):

$$N_{CBPS1,LAST,init} = \begin{cases} a_{init} N_{CBPS1,SHORT}, \text{ if } a_{init} < 4 \\ N_{CBPS1}, \text{ if } a_{init} = 4 \end{cases}.$$

For an SU PPDU, the number of pre-FEC pad bits:

$$N_{PAD1,Pre-FEC} = (N_{SYM1,init} - m_{STBC}) N_{DBPS1} + m_{STBC} N_{DBPS1,LAST,init} - (8 \times APEP\_LENGTH + N\_SERVICE),$$

a number of pre-FEC pad bits added by MAC:

$$N_{PAD1,Pre-FEC,MAC} = \left\lfloor \dfrac{N_{PAD1,Pre-FEC}}{8} \right\rfloor \times 8,$$

and a number of pre-FEC pad bits added by PHY:

$$N_{PAD1,Pre-FEC,PHY} = \text{mod}(N_{PAD1,Pre-FEC}, 8)$$

In a second step (Step 2), the number of payload bits and available bits are determined according to the following calculations, for a number of payload bits:

$$N_{pld} = (N_{SYM1,init} - m_{STBC}) N_{DBPS1} + m_{STBC} N_{DBPS1,LAST,init}$$

and a number of available bits:

$$N_{avbits1} = (N_{SYM1,init} - m_{STBC}) N_{CBPS1} + M_{STBC} N_{CBPS1,LAST,init}$$

In a third step (Step 3), the number of LDPC codewords $N_{CW1}$ and the length of the codewords $CW_1$ to be used may be determined based on payload size $N_{pld}$ and the initial $N_{avbits1}$, for example using Table 19-15 (of the IEEE 802.11ax specification draft D4.0).

In a fourth step (Step 4), the number of shortening zero bits may be determined based on the following calculations for a total number of shortening bits:

$$N_{shrt1} = \max(0, N_{CW1} \cdot CW_1 \cdot R_1 - N_{pld}).$$

When $N_{shrt1} = 0$, shortening is not performed. When $N_{shrt1} > 0$, shortening bits are equally distributed over all codewords according to the following calculations for a minimum number of shortening bits:

$$N_{spcw} = \left\lfloor \dfrac{N_{shrt1}}{N_{CW1}} \right\rfloor.$$

For the first rem($N_{shrt1}$, $N_{CW1}$) codewords, the kth codeword has $$N_{pld,1k} = CW_1 \cdot R_1 - N_{spcw} - 1 \text{ payload bits, and}$$

$$N_{shrt1,k} = N_{spcw} + 1 \text{ shortening bits.}$$

For the remaining codewords, the kth codeword has $$N_{pld,1k} = CW_1 \cdot R_1 - N_{spcw} \text{ payload bits, and}$$

$$N_{shrt1,k} = N_{spcw} \text{ shortening bits.}$$

The information bits of the kth codeword may be denoted as $$i^{(k)} = (i_0^{(k)}, i_1^{(k)}, \ldots, i_{CW_1 \cdot R_1 - 1}^{(k)}) = (i_0^{(k)}, i_1^{(k)}, \ldots, i_{CW_1 \cdot R_1 - N_{shrt1,k} - 1}^{(k)}, 0_{1 \times N_{shrt1,k}})$$

In a fifth step (Step 5), the number of bits to be punctured may be calculated as:

$$N_{punc} = \max(0, N_{CW1} \cdot CW_1 - N_{avbits1} - N_{shrt1})$$

If either of the following conditions is true, $N_{avbits1}$ is increased by an extra OFDM symbol segment, and LDPC extra symbol segment indicator is set as 1:

$$N_{punc} > 0.3 \cdot N_{CW1} \cdot CW_1 \cdot (1 - R_1), \text{ and}$$

$$N_{punc} > 0.1 \cdot N_{CW1} \cdot CW_1 \cdot (1 - R_1) \text{ and } N_{shrt} < 1.2 \cdot N_{punc} \cdot R_1 / (1 - R_1).$$

If with an extra OFDM symbol segment, the following may be recomputed. Final number of available bits:

$$N_{avbits1} = \begin{cases} N_{avbits1} + m_{STBC}(N_{CBPS1} - 3N_{CBPS1,SHORT}), \text{ if } a_{init} = 3 \\ N_{avbits1} + m_{STBC} N_{CBPS1,SHORT}, \text{ otherwise} \end{cases}.$$

Final number of OFDM symbols:

$$N_{SYM1} = \begin{cases} N_{SYM1,init} + m_{STBC} \text{ and } a = 1, \text{ if } a_{init} = 4 \\ N_{SYM1,init} \text{ and } a = a_{init} + 1, \text{ otherwise} \end{cases}.$$

Otherwise:

$$N_{SYM1} = N_{SYM1,init} \text{ and } a = a_{init}.$$

With the final pre-FEC padding factor:

$$N_{CBPS1,LAST} = \begin{cases} a N_{SBPS1,SHORT}, \text{ if } a < 4 \\ N_{CBPS1}, \text{ if } a = 4 \end{cases},$$

and $$N_{DBPS1,LAST} = N_{DBPS1,LAST,init}.$$

Final number of bits to be punctured:

$$N_{punc} = \max(0, N_{CW1} \cdot CW_1 - N_{avbits1} - N_{shrt1}).$$

Minimum number of punctured parity bits per codeword:

$$N_{ppcw} = \left\lfloor \dfrac{N_{punc}}{N_{CW1}} \right\rfloor.$$

For the first rem($N_{punc}$, $N_{CW1}$) codewords, the kth codeword punctures last:

$$N_{punc,1k} = N_{ppcw} + 1 \text{ parity bits.}$$

For the Remaining codewords, the kth codeword punctures last:

$N_{punc,1k} = N_{ppcw}$ parity bits.

In a sixth step (Step 6), the number of bits to be repeated are calculated based on the following calculations. Number of coded bits to be repeated:

$N_{rep} = \max(0, N_{avbits1}[N_{pld} + N_{CW1} \cdot CW_1 \cdot (1-R_1)])$.

Minimum number of repetition bits per codeword:

$$N_{rpcw} = \left\lfloor \frac{N_{rep}}{N_{CW1}} \right\rfloor.$$

For the first $\text{rem}(N_{rep}, N_{CW1})$ codewords, the number of repetition bits for the kth codeword is:

$N_{rep,1k} = N_{rpcw} + 1$.

For the remaining codewords, the number of repetition bits for the kth codeword is:

$N_{rep,1k} = N_{rpcw}$.

In a seventh step (Step 7), the post-FEC padding is calculated based on the following calculations. Number of post-FEC padding bits in each of the last $m_{STBC}$ symbol(s):

$N_{PAD,Post-FEC} = N_{CBPS1} - N_{CBPS1,LAST}$.

In an eighth step (Step 8), broken down as separate steps 8a-8c, coded bits are generated as follows. In step 8a, parity bits are generated and the parity bits of the kth codeword may be denoted as follows:

$p^{(k)} = (p_0^{(k)}, p_1^{(k)}, \ldots, p_{CW_1 \cdot R_1(1-R_1)-1}^{(k)})$.

The systematic parity check matrix of the selected LDPC code may be denoted as:

$H = [H_i \; H_p]$, where H has dimension of $CW_1 \cdot (1-R_1) \times CW_1$, $H_i$ has dimension of $CW_1 \cdot (1-R_1) \times CW_1 \cdot R_1$ and $H_p$ has dimension of $CW_1 \cdot (1-R_1) \times CW_1 \cdot (1-R_1)$. The kth codeword $c^{(k)} = (i^{(k)}, p^{(k)})$ is generated according to $Hc^{(k)T} = 0$ (where $H = [H_i \; H_p]$) and the matrix computations are modulo-2 operations. The parity bits could be generated from the information bits as:

$p^{(k)T} = H_p^{-1} H_i i^{(k)}$.

After discarding shortening bits, the kth codeword becomes:

$c^{(k)} = (i_{CW_1 \cdot R_1 - N_{shrt1,k}-1}^{(k)}, p^{(k)})$.

In step 8b, puncturing may be performed. After puncturing, the kth codeword becomes:

$c^{(k)''} = (i_0^{(k)}, i_1^{(k)}, \ldots, i_{CW_1 \cdot R_1 - N_{shrt1,k}}^{(k)} p_0^{(k)}, p_1^{(k)}, \ldots, p_{CW_1 \cdot R_1 - N_{punc,1k}-1}^{(k)})$.

In step 8c, repetition may be performed, where the repetition bits for the kth codeword are generated circularly starting from the beginning of $c^{(k)''}$.

The following modifications may be made for an initial transmission of an MU-PPDU (relative to the steps described above for initial transmission of an SU-PPDU). For Step 1, the SU PPDU calculations may be modified as follows. Compute initial pre-FEC padding factor $a_{init,u}$ for each user u and the initial number of OFDM symbols as described above for initial transmission of an SU-PPDU, derive the user index with the longest encoded packet duration:

$u_{max} = \arg\max_{u=0}^{N_{user,total}-1}(N_{SYM,init,u} - m_{STBC} + 0.25 m_{STBC} a_{init,u})$, and the common parameter:

$N_{SYM,init} = N_{SYM,init,u_{max}}$ and $a_{init,u_{max}}$.

Each user's initial number of data bits and initial number of coded bits in each of its last $m_{STBC}$ symbol(s) $N_{DBPS1,LAST,init,u}$ and $N_{CBPS1,LAST,init,u}$, number of pre-FEC padding bits $N_{PAD,Pre-FEC,u}$, number of payload bits $N_{pldx}$, initial number of available bits $N_{avbits1,u}$ accordingly.

For each user with LDPC encoding, a determination may be made if an extra symbol segment may be needed. As long as at least one user needs an extra symbol segment, the LDPC extra symbol segment indicator is set as 1, update the number of available bits $N_{avbits1,u}$, number of OFDM symbol $N_{SYM}$ and final pre-FEC padding factor α accordingly. The number of puncturing bits and number of repetition bits and other parameters may be computed accordingly.

For Step 2, for each user with LDPC encoding, coded bits may be generated using same procedure as described above for initial transmission of an SU-PPDU.

For each SU PPDU retransmissions, the same pre-FEC pad bits may be kept by MAC and PHY (layers) as in the initial transmission to get same payload bits for each codeword. There may be no need to use same pre-FEC padding factor $a_2$ (only to indicate how many coded bits in each of the last $m_{STBC}$ OFDM symbols, since the pre-FEC padding is not according to it) and post-FEC padding. SU-PPDU retransmission LDPC encoding may be according to the following steps.

In a first step (Step 1), the same codewords as in initial transmission may be obtained, with all parity bits. The kth codeword is:

$c^{(k)'} = (i_0^{(k)}, i_1^{(k)}, \ldots, i_{CW_1 \cdot R_1 - N_{shrt1,k}-1}^{(k)}, p^{(k)})$.

The steps described above for the initial transmission may be used to generate exactly same codewords. Alternatively, the codewords generated for the initial transmission may be stored and loaded.

For a second step (Step 2), a puncturing pattern and ratio (p_ratio) may be determined. As used herein, the term "puncturing" here is not the puncturing step in LDPC in 11n/ac/ax, but rather refers to a way of selecting coded bits ("puncturing" from all generated coded bits) to form a HARQ transmission. Thus, such puncturing could specify what bits to puncture (e.g., only parity bits, or both info bits and parity bits, etc.) and how to do puncturing (e.g., puncturing x bit(s) every y bits, etc.). To provide incremental (additional information) effort may be made to use some punctured (and unsent) parity bits in the initial transmissions for "incremental redundancy."

Starting from the kth codeword:

$c^{(k)'} = (i_0^{(k)}, i_1^{(k)}, \ldots, i_{CW_1 \cdot R_1 - N_{shrt1,k}-1}^{(k)}, p^{(k)})$, coded bits could be punctured to fill a certain number of OFDM symbols followed by $a_2$ OFDM symbol segments and post-FEC padding for retransmission according to the following calculations. The number of available bits may be expressed as:

$N_{avbits1} = N_{pld} + N_{CW1} \cdot CW_1 \cdot (1-R_1)$.

The number of chosen coded bits per OFDM symbol in retransmission may be expressed as:

$N_{CBPS2} = N_{BPSCS2} N_{SD2} N_{SS2}$ where $N_{BPSCS2}$ is the modulation order, $N_{SD2}$ is the number of subcarriers in the RU, $N_{SS2}$ is the number of spatial streams, and:

$N_{CBPS2,SHORT} = N_{BPSCS2} N_{SD2,SHORT} N_{SS2}$.

The number of chosen coded bits per OFDM symbol in each of the last $m_{STBC}$ OFDM symbol(s) in retransmission:

$$N_{CBPS2,LAST} = \begin{cases} a_2 N_{CBPS2,SHORT}, & \text{if } a_2 < 4 \\ N_{CBPS2}, & \text{if } a_2 = 4 \end{cases}.$$

Number of post-FEC padding bits in each of the last $m_{STBC}$ symbol(s):

$$N_{PAD,Post-FEC} = N_{CBPS2} - N_{CBPS2,LAST}.$$

The total number of chosen coded bits $N_{TRCB2}$ and number of OFDM symbols $N_{SYM2}$ in retransmission are related as:

$$N_{TRCB2} = (N_{SYM2} - m_{STBC}) N_{CBPS2} + m_{STBC} N_{CBPS2,LAST}.$$

It may be noted that the LDPC extra symbol segment indicator may be set as 0 for SU. According to a first option (Option A), given resource allocation (modulation order, number of subcarriers, number of spatial streams, number of OFDM symbols $N_{SYM2}$, and pre-FEC padding factor $a_2$), the puncturing ratio (p_ratio) and puncturing pattern may be determined. The total number of chosen coded bits in the retransmission:

$$N_{TRCB2} = (N_{SYM2} - m_{STBC}) N_{CBPS2} - m_{STBC} N_{CBPS2,LAST}.$$

Minimum number of chosen coded bits per codeword in the retransmission:

$$N_{RCBpcw2} = \left\lfloor \frac{N_{TRCB2}}{N_{CW1}} \right\rfloor.$$

For the first $\text{rem}(N_{TRCB2}, N_{CW1})$ codewords, the number of chosen coded bits for the kth codeword in the nth retransmission is:

$$N_{RCBpcw2,k} = N_{RCBpcw2} + 1.$$

For the remaining codewords, the number of chosen coded bits for the kth codeword in the nth retransmission is:
Performance analysis may be performed to identify a suitable puncturing pattern (what coded bits to choose and how many each of them). According to a second option (Option B), given the puncturing ratio and puncturing pattern, resource allocation (given modulation order, number of subcarriers, and number of spatial streams, determine number of OFDM symbols $N_{SYM2}$, pre-FEC padding factor $a_2$, and post-FEC padding) may be determined. Performance analysis may be performed to identify a suitable puncturing pattern (what coded bits to choose, and the minimum number of each type of coded bits per codeword in the retransmission $N_{RCBpcw2}$) modulation order and number of spatial streams. A minimum total number of chosen coded bits in the retransmission may be expressed as:

$$N_{mTRCB2} = N_{RCBpcw2} N_{CW1}.$$

Resource allocation (number of subcarriers may be given) may be chosen such that the number of OFDM symbols is the minimum integer to satisfy:

$$N_{CBPS2} N_{SYM2} \geq N_{mTRCB2}, \text{ i.e., } N_{SYM2} = \left\lceil \frac{N_{mTRCB2}}{N_{CBPS2}} \right\rceil.$$

And then the pre-FEC padding factor $a_2$ is the minimum to satisfy:

$$m_{STBC} N_{CBPS2,LAST} \geq N_{TRCB2} - (N_{SYM2} - m_{STBC}) N_{CBPS2},$$

such that $$a_2 = \begin{cases} \left\lceil \dfrac{N_{TRCB2} - (N_{SYM2} - m_{STBC}) N_{CBPS2}}{m_{STBC} N_{CBPS2,SHORT}} \right\rceil, & \text{if } a_2 < 4 \\ 4, & \text{otherwise} \end{cases}.$$

For the first $\text{rem}(N_{TRCB2}, N_{CW1})$ codewords, the number of chosen coded bits for the $k^{th}$ codeword in the retransmission is $N_{RCBpcw2,k} = N_{RCBpcw2} + 1$. For the remaining codewords, the number of chosen coded bits for the kth codeword in the retransmission is:

$$N_{RCBpcw2,k} = N_{RCBpcw2}.$$

For MU-PPDU retransmission, the above described step 2 is modified as follows. Option B may be used to determine the initial number of OFDM symbols $N_{SYM2,init,u}$ and pre-FEC padding factor $a_{2,init,u}$ for user u. All user may use a common initial pre-FEC padding factor $a_{2,init}$ and a common initial number of OFDM symbols $N_{SYM2,init}$ determined in same process as for the initial transmission for MU-PPDU described above. After the final pre-FEC padding factor $a_2$ and final number of OFDM symbols $N_{SYM2}$ are determined, option A may be used to determine the puncturing ratio and puncturing pattern. A user with HARQ retransmission does not use results in an LDPC extra symbol segment.

Additional details are provided below for particular implementations of the LDPC encoding process according to design option 2 (LDPC extension for IR HARQ).

For a first LDPC encoding process modification option 1, parameters (codeword size, number of codewords, number of OFDM symbols, pre-FEC padding factor, number of shortening bits, etc.) are first determined based on the high rate code in the initial transmission. And then they are extended for these used in retransmission(s).

According to a first option (Sub-option 1a), an initial transmission LDPC encoding may use an encoder for the high rate code (R1 & CW1). According to a second option (Sub-option 1b), initial transmission LDPC encoding may use an encoder for the mother code (R0 & CW0), and then puncture mother codewords to get high rate R1 and shorter codeword of size CW1.

For a second encoding process modification option 2, parameters (codeword size, number of codewords, number of shortening bits, etc.) are first determined based on the mother code. Subsequently, codewords are punctured for initial transmission or each retransmission, and packed into a certain number of OFDM symbols followed and a few OFDM symbol segment(s). In initial transmission, the actual coding rate may not be the specified coding rate R1 LDPC encoding may use an encoder for the mother code (R0 & CW0), and then puncture mother codewords for different (re)transmission(s)

For following steps may be performed for initial transmissions for SU/MU PPDU. The LDPC encoding process for SU or MU PPDU for LDPC Design Option 2 may the same as the one for SU or MU PPDU (Design option 1) described above, except for the following modifications. For Step 3, the way of computing the number of LDPC codewords $N_{CW1}$ and the length of the codewords $CW_1$ to be used:

LDPC encoding modification option 1: $CW_1$ and $N_{CW1}$ are determined based on payload size $N_{pld}$ and the initial $N_{avbits1}$, LDPC design option 1: Use Table 19-15 (of the IEEE 802.11ax specification draft D4.0), LDPC design option 2: Apply new rules to determine $CW_1$ and $N_{CW1}$. Table 19-15 (of the IEEE 802.11ax specification draft D4.0) parameters may be modified to include shorter codeword sizes of $CW_1$. Alternatively, use LDPC encoding modification option 2's method.

LDPC encoding modification option 2: Determine mother codeword size $CW_0$ and number of codewords $N_{CW1}$ by using Table 19-15 (of the IEEE 802.11ax specification draft D4.0) and code rate $R_1$. Then, the high rate codeword size is $CW_1=CW_0R_0/R_1$.

The LDPC encoding process for SU or MU PPDU for LDPC Design Option 2 may be the same as the one for SU or MU PPDU described above (Design option 1), except for the following modifications: For Step 8a, the way of generating parity bits:

Encoding process modification sub-option 1a: same as the one for SU or MU PPDU described above (Design option 1).

Encoding process modification sub-option 1b & option 2: generate the mother codewords and then puncture them to obtain high rate codewords.

Denote the additional parity bits of the $k^{th}$ mother codeword as $q(k)=(q_0^{(k)},q_1^{(k)}, \ldots ,q_{CW_0-CW_1-1}^{(k)})$.

The $k^{th}$ mother codeword $c_M^{(k)}=(i^{(k)},p^{(k)},q^{(k)})$ is generated according to $H_M c_M^{(k)T}=0$ where the matrix computations are modulo-2 operations.

Discard shortening bits and the $k^{th}$ mother codeword becomes $c_M^{(k)'}=(i_0^{(k)},i_1^{(k)}, \ldots ,i_{CW_1 \cdot R_1-N_{shrt1,k}-1}^{(k)},p^{(k)}),q^{(k)})$.

Discard additional parity bits $q^{(k)}$ to get the $k^{th}$ high rate codeword $c^{(k)'}=(i_0^{(k)},i_1^{(k)}, \ldots ,i_{CW_1 \cdot R_1-N_{shrt1,k}-1}^{(k)},p^{(k)})$.

For SU/MU PPDU retransmissions, for step 1, the mother code's codeword size $CW_0$, number of codewords $N_{CW0}$, and number of shortening zero bits may be computed as follows:

Assume same payload bits in each codeword between (re)transmission(s).

Number of codewords are the same, i.e., $N_{CW0}=N_{CW1}$.

Codeword size $CW_0=CW_1R_1/R_0$.

The mother code and the high rate code used in initial transmission essentially have same number of shortening bits, for the kth codeword $N_{shrt0,k}=N_{shrt1,k}$.

For SU/MU PPDU retransmissions, for Step 2, the puncturing pattern and ratio (p_ratio) may be determined as follows:

Starting from the kth mother codeword $c_M^{(k)}=(i_0^{(k)}, i_1^{(k)}, \ldots ,i_{CW_1 \cdot R_1-N_{shrt1,k}-1}^{(k)},p^{(k)},q^{(k)})$, we could puncture coded bits to fill a certain number of OFDM symbols followed by $a_2$ OFDM symbol segments and post-FEC padding for retransmission.

Number of available bits $N_{avbits0}=N_{pld}+N_{CW0}\cdot CW_0\cdot(1-R_0)$

Options A & B are the same as the ones for SU or MU PPDU as described above (Design option 1).

As described therein, retransmissions may have an aggregation (of initial or retransmissions) and also can carry new data (such as one part may be a HARQ retransmission of a failed packet or portions of a failed packet, while another part may be new data).

According to one option, an aggregated PPDU (A-PPDU) may have each PPDU for HARQ re-transmission of (failed portions of) a failed packet, as well as new data. According to this option, a first (few) PPDU(s) may be for HARQ re-transmission(s) to minimize LLR buffer size (for the number of coded bits whose LLRs need be stored). When using an A-PPDU, the HARQ 2nd transmission and new data may have clear OFDM symbol boundaries.

According to a second option, one PPDU may be used. In this case, data generation for HARQ retransmission and new data may be separate. The PPDU may be an aggregation of HARQ re-transmission and new data at a certain level (such as QAM level in subcarrier mapping).

Due to separate encoding, for this second option, the HARQ re-transmitted data and new data may have separate pre-FEC padding, service fields and possible, post-FEC padding, and use different scrambling seeds. HARQ re-transmitted data may be aggregated before new data to minimize LLR buffer size. LLR buffer may be released after receiver processing of HARQ re-transmitted data. The aggregation of HARQ re-transmitted data and new data may be at QAM level after spatial mapping, with possible padded QAM symbols in between. According to a first sub-option, Option 2a, post-FEC padding may be used to ensure clear OFDM symbol boundaries between different parts. According to a second sub-option, Option 2b, different parts may load different subcarriers in one OFDM symbol. The first part (e.g., HARQ re-transmitted QAM symbols) are first mapped to subcarriers and fill an integer number of OFDM symbols. The leftover of the first part may fill a number of subcarriers in an OFDM symbol afterwards. Some padding may fill some subcarriers in that OFDM symbol. The $2^{nd}$ part (e.g., new data QAM symbols) may fill the rest of the subcarriers in that OFDM symbol, and other OFDM symbols. And this process is repeated until all parts are aggregated. Prefer to have each part pad to a number of symbol segments for easier in signaling and processing Depending on the frame structure option (option 1 or 2 above), there are in general two cases between different parts.

In a first case (Case 1), there are clear OFDM symbol boundaries between different parts. There is clear OFDM symbol boundaries between different parts. Each part starts with a whole new OFDM symbol, and may have pre-FEC padding to fill part of each of the last $m_{STBC}$ OFDM symbol(s). Each part may have post-FEC padding to fill all remaining subcarriers of each of the last $m_{STBC}$ OFDM symbol(s) as in flax. Each part may further have an extra OFDM symbol as packet extension (at end of packet) or PPDU extension (at end of PPDU) or part extension (at end of part) to buy time for receiver processing of this part.

In a second case (Case 2), with transition OFDM symbol(s) between different parts, there may be no clear OFDM symbol boundaries between different parts. Different parts may load data and/or post-FEC padding in different subcarriers in transition OFDM symbol(s). A transition OFDM symbol is an OFDM symbol where subcarriers are loaded with data from different parts, or loaded with data from one part and post-FEC padding or part extension from another part. Each part may have post-FEC padding to fill a certain number of OFDM symbol segments in each of the last $m_{STBC}$ OFDM symbol(s) after each part, but not necessarily need to fill all remaining subcarriers of each of such symbol(s) as in 11ax. Alternatively, no post-FEC padding is used between different parts. Each part may further have packet extension (at end of packet) or part extension (at end of part) to buy time for receiver processing of this part. The number of symbol segments of post-FEC padding may be referred to as the post-FEC padding factor. The number of symbol segment of part extension may be referred to as the part extension factor.

For Case 1, the following example uses a 3-part scenario as an example, but more parts could be derived accordingly. For each part, the LDPC encoding process for SU/MU is same as described above (for design option 1 or design option 2), except the following assumptions may be made and actions performed for MU:

Assume the number of OFDM symbol as PPDU extension of part extension between two parts is $N_{SYM,PE}$, this could be 0 or 1;

1st part as HARQ 2nd transmission;

Make sure the number of OFDM symbols $N_{SYM,part1,u}$ and pre-FEC padding factor $a_{part1,u}$ do not exceed the max of other users, i.e., $N_{SYM,part1,u} \leq N_{SYM,init}$ and $4(N_{SYM,part1,u}-m_{STBC})+a_{part1,u} \leq 4(N_{SYM,init}-m_{STBC})+a_{init}$;

2nd part as HARQ 2nd transmission or new data;

If the 2nd part is the last part, use the accumulated number of OFDM symbols $N_{SYM,init,u}=N_{SYM,part1,u}+N_{SYM,PE}+N_{SYM,part2,init,u}$ in deriving $N_{SYM,init}$. Otherwise, make sure the accumulated number of OFDM symbols $N_{SYM,part1,u}+N_{SYM,PE}+N_{SYM,part2,u}$ and pre-FEC padding factor $a_{part2,u}$ do not exceed the max of other users, i.e., $N_{SYM,part1,u}+N_{SYM,PE}+N_{SYM,part2,u} \leq N_{SYM,init}$ and $4(N_{SYM,part1,u}+N_{SYM,PE}+N_{SYM,part2,u}-m_{STBC})+a_{part2,u} \leq 4(N_{SYM,init}-m_{STBC})+a_{init}$;

3rd part as HARQ 2nd transmission or new data; and

If the 3rd part is the last part, use the accumulated number of OFDM symbols $N_{SYM,init,u}=N_{SYM,part1,u}+N_{SYM,part2,u}+N_{SYM,part3,init,u}$ in deriving $N_{SYM,init}$. Otherwise, also make sure the accumulated number of OFDM symbols and pre-FEC padding factor do not exceed the max of other users.

For Case 2, the following uses a 2-part scenario as an example, but more parts could be derived accordingly. For each part, the LDPC encoding process for SU/MU may be the same as described above for design option 1 or design option 2, except the following assumptions may be made and actions performed for MU:

1st part as HARQ 2nd transmission;

For MU, make sure the number of OFDM symbols $N_{SYM,part1,u}$ and pre-FEC padding factor $a_{part1,u}$ do not exceed the max of other users, i.e., $N_{SYM,part1,u} \leq N_{SYM,init}$ and $4(N_{SYM,part1,u}-m_{STBC})+a_{part1,u} \leq 4(N_{SYM,init}-m_{STBC})+a_{init}$;

2nd part as HARQ 2nd transmission or new data;

The number of OFDM symbols for 2nd part $N_{SYM,part2,u}$ is defined as from the first OFDM symbol after the last transition OFDM symbol to the last OFDM symbol loaded with data and/or post-FEC padding of 2nd part;

If a transition OFDM symbol has data and post-FEC padding of 1st part, as well as data of 2nd part;

The pre-FEC padding factor for 1st part is $a_{part1,u}$, the post-FEC padding factor of 1st part is $b_{part1,u}$, the loading factor of 2nd part is $c_{part2,u}=\max(0.4-a_{part1,u}-b_{part1,u})$; and If the 2nd part is the last part, use the accumulated number of OFDM symbols $N_{SYM,init,u}=N_{SYM,part1,u}+N_{SYM,part2,init,u}$ in deriving $N_{SYM,init}$. Otherwise, make sure the accumulated number of OFDM symbols $N_{SYM,part1,u}+N_{SYM,part2,u}$ and pre-FEC padding factor $a_{part2,u}$ do not exceed the max of other users, i.e., $N_{SYM,part1,u}+N_{SYM,part2,u} \leq N_{SYM,init}$ and $4(N_{SYM,part1,u}+N_{SYM,part2,u}-m_{STBC})+a_{part2,u} \leq 4(N_{SYM,init}-m_{STBC})$ $a_{init}$.

For Case 2, the following uses a 2-part scenario as another example, but more parts could be derived accordingly. For each part, the LDPC encoding process for SU/MU may be the same as described above for Design option 1 or Design option 2, except the following assumptions may be made and actions performed:

$2^{nd}$ part as HARQ $2^{nd}$ transmission or new data;

If a transition OFDM symbol has some post-FEC padding or part extension of $1^{st}$ part, as well as data of $2^{nd}$ part;

The pre-FEC padding factor for $1^{st}$ part is $a_{part1,u}$, the post-FEC padding factor of $1^{st}$ part is $b_{part1,u}$, the part extension factor of $1^{st}$ part is $d_{part1,u}$, $4 \leq a_{part1,u}+b_{part1,u}+d_{part1,u}<8$. The number of symbol segments in the transition OFDM symbol that is occupied by $1^{st}$ part is $a_{part1,u}+b_{part1,u}+d_{part1,u}-4$. The loading factor of $2^{nd}$ part is $c_{part2,u}=\max(0.4-(a_{part1,u}+b_{part1,u}+d_{part1,u}-4))$. The number of loading subcarriers for $2^{nd}$ part is $N_{SD,part2,u}=$ $$\begin{cases} N_{SD} - c_{part2,u}N_{SD,SHORT}, & \text{if } 0 < c_{part2,u} < 4 \\ 0, & \text{if } c_{part2,u} = 0 \end{cases}.$$

In LDPC encoding parameter calculations, the number of available bits $N_{avbits2}$ is replaced by the number of available bits starting from OFDM symbols after the transition OFDM symbol, i.e., $N_{avbits2}=N_{BPSCS}N_{SD,part2,u}N_{SS}$; and If the $2^{nd}$ part is the last part, use the accumulated number of OFDM symbols $N_{SYM,init,u}=N_{SYM,part1,u}+N_{SYM,PE,part1}+N_{SYM,part2,init,u}$ in deriving $N_{SYM,init}$. Otherwise, make sure the accumulated number of OFDM symbols $N_{SYM,part1,u}+N_{SYM,PE,part1}+N_{SYM,part2,u}$ and pre-FEC padding factor $a_{part2,u}$ do not exceed the max of other users, i.e., $N_{SYM,part1,u}+N_{SYM,PE,part1}+N_{SYM,part2,u} \leq N_{SYM,init}$ and $4(N_{SYM,part1,u}+N_{SYM,PE,part1}+N_{SYM,part2,u}-m_{STBC})+a_{part2,u} \leq 4(N_{SYM,init}-m_{STBC})+a_{init}$, where $$N_{SYM,PE,part1} = \begin{cases} 1, & \text{if } 0 < c_{part2,u} < 4 \\ 0, & \text{if } c_{part2,u} = 0 \end{cases}.$$

As described above, the LDPC code based IR-HARQ encoding schemes presented herein may support various code rates, resulting in different numbers of parity bits and overall code bits. In particular implementations, only a longest LDPC code word (such as 1944 bits) may be supported, which may be reasonable given HARQ is typically designed for large blocks of data.

FIG. 15 shows example parity and code bits for different code rates for 1944 code bits. As shown, for a code rate of ½, there are 972 information bits and 972 parity bits. For a code rate of ⅔, there are 1296 information bits and 648 parity bits. For a code rate of ¾, there are 1458 information bits and 486 parity bits. For a code rate of ⅚, there are 1620 information bits and 324 parity bits.

For one particular implementation, a limited number of codeword puncturing designs may be supported for an initial HARQ transmission. For example, four puncture rates may be supported as follows:

Puncture Rate=0% (100% of the code bits transmitted);
Puncture Rate=5% (95% of the code bits transmitted);
Puncture Rate=10% (90% of the code bits transmitted); and
Puncture Rate=20% (80% of the code bits transmitted).

As noted above, puncturing may only be performed on the parity bits, but the percentages shown are based on the full codeword.

FIGS. 16-19 show the number of parity bits transmitted for an initial HARQ transmission for example IR-HARQ encoding configurations based on the code rates shown in FIG. 15 and the four puncture rates shown above.

As shown in FIG. 16, for a code rate of ½, the number of transmitted parity bits range from the full 972 (for 0% puncture rate) to 583 (for 20% puncture rate). As shown in FIG. 17, for a code rate of ⅔, the number of transmitted parity bits range from the full 648 (for 0% puncture rate) to 259 (for 20% puncture rate). As shown in FIG. 18, for a code rate of ¾, the number of transmitted parity bits range from the full 486 (for 0% puncture rate) to 97 (for 20% puncture rate). As shown in FIG. 19, for a code rate of ⅚, the number of transmitted parity bits range from the full 324 (for 0% puncture rate) to 130 (for 10% puncture rate). A puncturing rate of 20% may not be supported for a code rate of ⅚ as this would result in all the parity bits being punctured.

Figure 20:
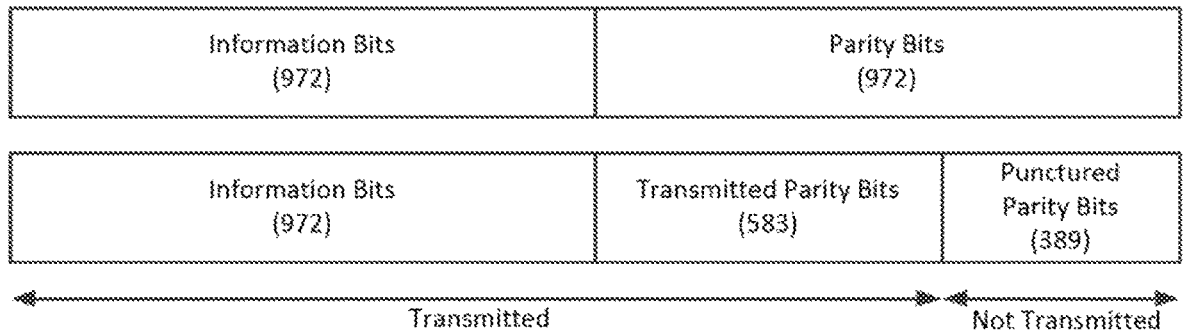
FIG. 20 shows an example codeword according to the code rate and one of puncture rates shown in FIG. 16.

FIG. 20 shows an example codeword according to the code rate of ½ and a puncture rate of 20% (corresponding to the last row of the table shown in FIG. 16). As shown, of the 972 parity bits, 583 parity bits are transmitted, while 389 parity bits are punctured (not included in the initial transmission). As described above, however, in the event the initial transmission is not successfully received, these punctured parity bits may be included as "incremental" parity bits in a subsequent HARQ codeword retransmission.

Figure 21:
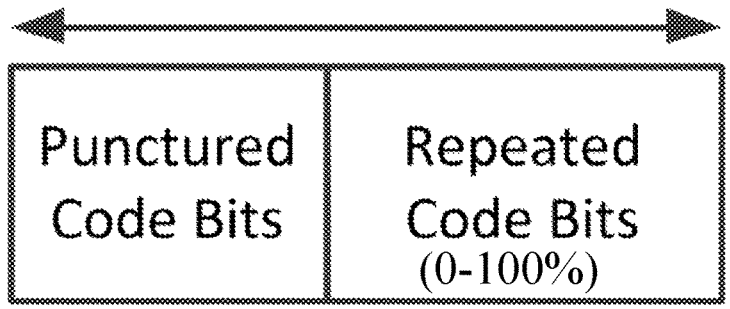
FIG. 21 shows an example format of a codeword retransmission.

As shown in FIG. 21, a HARQ retransmission of a codeword may include two parts:
1) punctured parity bits that were punctured (and not included) in the initial codeword transmission; and
2) repeated transmission of code bits that were sent in the initial transmission.

In some implementations, a limited number of percentages of repeated transmitted code bits may be supported. For example, four possible percentage of repeated transmitted code bits may be supported: 0%, 25%, 50% and 100%. In such cases, these percentages of repeated transmitted code bits are interpreted as:
0%→No repeated code bits in the Codeword Retransmission;
25%→Every fourth code bit included in the Codeword Retransmission;
50%→Every other code bit included in the Codeword Retransmission; and
100%→All code bits included in the Codeword Retransmission.

It may be noted that FIGS. 20 and 21 generally refer to an incremental redundancy (IR) design for 2 transmissions and may be used for the case when the maximum number of transmissions is 2 (such as one initial transmission and possibly one retransmission). For the case of larger than 2 total transmissions (such as up to 4 total transmissions), the design could be generalized. For example, after 2 transmissions, if retransmission is still needed, chase combining like retransmissions of code bits could be started. Alternatively, for a design of up to N transmissions, not all punctured parity bits are sent in the $2^{nd}$ transmission. In each retransmission, there may be parity bits that have never been sent in previous transmissions, and these kind of bits may be sent.

As described herein, combining LDPC encoding techniques with HARQ mechanisms may allow great flexibility in meeting a wide range of data throughput demands, while maintaining reliability.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

The invention claimed is:

1. An apparatus for wireless communications, comprising:
 a processing system configured to:
  generate a first packet using a first low density parity check (LDPC) encoding process, the first packet having a set of information bits and a first set of parity bits,
  generate coded bits using a second LDPC encoding process if the first packet is not successfully decoded by a wireless device,
   wherein the coded bits generated using the second LDPC encoding process include at least some of the same set of information bits as the first packet and a second set of parity bits, and
   wherein the second LDPC encoding process has different puncturing than the first LDPC encoding process to select a set of new parity bits to generate the second set of parity bits that are different from the first set of parity bits and a subset of the set of information bits, and
  generate a second packet including at least some of the coded bits generated using the second LDPC encoding process; and
 an interface configured to output the first and second packets for transmission.

2. The apparatus of claim 1, wherein the second LDPC encoding process generates the coded bits based on same information bits as the first LDPC encoding process.

3. The apparatus of claim 1, wherein the first and second packets are output for transmission as part of an incremental redundancy (IR) hybrid automatic repeat request (HARD) process.

4. The apparatus of claim 1, wherein the interface is configured to vary at least one of a modulation scheme, a number of subcarriers, or a number of spatial streams when outputting the first and second packets for transmission.

5. The apparatus of claim 1, wherein generating the coded bits using the second LDPC encoding process comprises generating the second set of parity bits by applying the different puncturing than the first LDPC encoding process.

6. The apparatus of claim 5, wherein:
 the second packet includes parity bits that were punctured in the first LDPC encoding process and not included in the first packet.

7. The apparatus of claim 5, wherein the second packet includes a subset of the first set of parity bits included in the first packet.

8. The apparatus of claim 5, wherein the second packet comprises the set of new parity bits and a subset of the first set of parity bits included in the first packet.

9. The apparatus of claim 1, wherein:
 the first LDPC encoding process uses a first LDPC code; and
 the second LDPC encoding process uses a second LDPC code.

10. The apparatus of claim 9, wherein:
 the first LDPC code is associated with a first coding rate; and
 the second LDPC code is associated with a second coding rate that is lower than the first coding rate.

11. The apparatus of claim 1, wherein the coded bits generated by the second LDPC encoding process include additional parity bits not included in the first set of parity bits generated by the first LDPC encoding process.

12. The apparatus of claim 1, wherein the processing system is further configured to include an indication in at least one of the first packet or the second packet indicating whether an extra orthogonal frequency division multiplexed (OFDM) symbol segment was used when generating the coded bits included therein.

13. The apparatus of claim 1, wherein the second packet includes at least one of an aggregation of a hybrid automatic repeat request (HARD) retransmission or new data bits not included in the first packet.

14. An apparatus for wireless communications, comprising:
- a first interface configured to obtain at least a portion of a first packet having a set of information bits and a first set of parity bits and to obtain at least a portion of a second packet having a subset of the set of information bits and a second set of parity bits comprising a set of new parity bits that are different from the first set of parity bits;
- a processing system configured to:
    - attempt to decode the information bits of the first packet using a first low density parity check (LDPC) decoding process,
    - generate a negative acknowledgment (NACK) packet notifying a wireless device that at least a portion of the information bits was not successfully decoded,
    - combine the portion of the first packet with the portion of the second packet, and
    - re-attempt to decode the portion of the information bits that was not successfully decoded based on combined first and second packets using a second LDPC decoding process; and
- a second interface configured to output the NACK packet for transmission.

15. The apparatus of claim 14, wherein the second LDPC decoding process assumes coded bits of the second packet were generated based on same information bits as the first LDPC encoding process.

16. The apparatus of claim 14, wherein the portion of the information bits that was not successfully decoded comprises at least one of a MAC protocol data unit (MPDU), a MAC service data unit (MSDU) or a codeword.

17. The apparatus of claim 14, wherein re-attempting to decode the portion of the information bits that was not successfully decoded involves setting log likelihood ratio (LLR) values to zero for unsent coded bits in order to decode using a first code rate and first codeword size.

18. The apparatus of claim 17, wherein attempting to decode the information bits of the first packet is based on a second code rate and second codeword size.

19. The apparatus of claim 14, wherein:
- at least one of the first packet or the second packet includes an indication of whether an extra orthogonal frequency division multiplexed (OFDM) symbol segment was used when generating coded bits included therein; and
- the processing system is configured to determine a codeword size based on the indication and to process the at least one of the first packet or the second packet based on the determined codeword size.

20. The apparatus of claim 14, wherein the second packet includes at least one of an aggregation of a hybrid automatic repeat request (HARD) retransmission or new data not included in the first packet.

21. A method for wireless communications, comprising:
- generating a first packet using a first low density parity check (LDPC) encoding process, the first packet having a set of information bits and a first set of parity bits;
- outputting the first packet for transmission;
- generating coded bits using a second LDPC encoding process if the first packet is not successfully decoded by a wireless device, wherein the coded bits generated using the second LDPC encoding process include at least some of the same set of information bits as the first packet and a second set of parity bits, wherein the second LDPC encoding process has different puncturing than the first LDPC encoding process to select a set of new parity bits to generate the second set of parity bits that are different from the first set of parity bits and a subset of the set of information bits;
- generating a second packet including at least some of the coded bits generated using the second LDPC encoding process; and
- outputting the second packet for transmission.

22. The method of claim 21, wherein the first and second packets are output for transmission as part of an incremental redundancy (IR) hybrid automatic repeat request (HARQ) process.

23. The method of claim 21, wherein the second packet includes a subset of the first set of parity bits included in the first packet.

24. The method of claim 21, wherein:
- the first LDPC code is associated with a first coding rate; and
- the second LDPC code is associated with a second coding rate that is lower than the first coding rate.

25. The method of claim 21, wherein the coded bits generated by the second LDPC encoding process include additional parity bits not included in the set of parity bits generated by the first LDPC encoding process.

26. The method of claim 21, further comprising:
- including an indication in at least one of the first packet or the second packet indicating whether an extra orthogonal frequency division multiplexed (OFDM) symbol segment was used when generating the coded bits included therein.

27. The method of claim 21, wherein the second packet includes at least one of an aggregation of a hybrid automatic repeat request (HARD) retransmission or new data bits not included in the first packet.

28. A method for wireless communications, comprising:
- obtaining at least a portion of a first packet having a set of information bits and a first set of parity bits;
- attempting to decode the information bits of the first packet using a first low density parity check (LDPC) decoding process;
- generating a negative acknowledgment (NACK) packet notifying a wireless device that at least a portion of the information bits was not successfully decoded;
- outputting the NACK packet for transmission;
- obtaining at least a portion of a second packet having a subset of the set of information bits and a second set of parity bits comprising a set of new parity bits that are different from the first set of parity bits;
- combining the portion of the first packet with the portion of the second packet; and
- re-attempting to decode the portion of the information bits that was not successfully decoded based on combined first and second packets using a second LDPC decoding process.

29. The method of claim 28, wherein re-attempting to decode the portion of the information bits that was not successfully decoded involves setting log likelihood ratio (LLR) values to zero for unsent coded bits in order to decode using a first code rate and first codeword size.

30. The method of claim 29, wherein attempting to decode the information bits of the first packet is based on a second code rate and second codeword size.

* * * * *